US012356737B2

(12) United States Patent
Tsuji et al.

(10) Patent No.: US 12,356,737 B2
(45) Date of Patent: Jul. 8, 2025

(54) IMAGING APPARATUS AND MANUFACTURING METHOD OF THE SAME

(71) Applicant: SONY SEMICONDUCTOR SOLUTIONS CORPORATION, Kanagawa (JP)

(72) Inventors: Mutsuo Tsuji, Kanagawa (JP); Daisuke Chino, Kanagawa (JP)

(73) Assignee: SONY SEMISCONDUCTOR SOLUTIONS CORPORATION, Kanagawa (JP)

(*) Notice: Subject to any disclaimer, the term of this patent is extended or adjusted under 35 U.S.C. 154(b) by 393 days.

(21) Appl. No.: 17/780,230

(22) PCT Filed: Sep. 30, 2020

(86) PCT No.: PCT/JP2020/037164
§ 371 (c)(1),
(2) Date: May 26, 2022

(87) PCT Pub. No.: WO2021/111716
PCT Pub. Date: Jun. 10, 2021

(65) Prior Publication Data
US 2022/0415937 A1 Dec. 29, 2022

(30) Foreign Application Priority Data
Dec. 4, 2019 (JP) .................. 2019-219540

(51) Int. Cl.
H10F 39/00 (2025.01)
H01L 23/14 (2006.01)
H01L 23/31 (2006.01)

(52) U.S. Cl.
CPC ............. H10F 39/80 (2025.01); H01L 23/14 (2013.01); H01L 23/31 (2013.01)

(58) Field of Classification Search
CPC ... H01L 27/14601; H01L 23/14; H01L 23/31; H01L 27/14685; H01L 27/14618; G02B 7/003; G02B 7/021; G02B 7/023
See application file for complete search history.

(56) References Cited

U.S. PATENT DOCUMENTS

2004/0164981 A1* 8/2004 Fujita ................ H01L 27/14618
257/E31.118
2009/0166784 A1 7/2009 Honda
(Continued)

FOREIGN PATENT DOCUMENTS

JP 03-021859 U 3/1991
JP H04002747 A 1/1992
(Continued)

OTHER PUBLICATIONS

International Search Report and Written Opinion of PCT Application No. PCT/JP2020/037164, issued on Dec. 8, 2020, 09 pages of ISRWO.

Primary Examiner — Thanh Luu
Assistant Examiner — Mai Thi Ngoc Tran
(74) Attorney, Agent, or Firm — CHIP LAW GROUP

(57) ABSTRACT

An imaging apparatus includes an imaging element, a wiring substrate, a sealing section, and fitting sections. The imaging element includes an imaging chip and pads. A light transmission section that transmits incident light is arranged on the imaging chip, and the imaging chip generates an image signal based on the incident light that has transmitted through the light transmission section. The pads are arranged on a bottom surface of the imaging chip which is a surface different from the surface on which the light transmission section is arranged and convey the generated image signal. The wiring substrate includes wiring that is connected to the pads, and the imaging element is arranged on a front surface of the wiring substrate. The sealing section is arranged (Continued)

adjacent to side surfaces of the imaging chip which are the surfaces adjacent to the bottom surface of the imaging chip and seals the imaging chip.

12 Claims, 15 Drawing Sheets

(56) References Cited

U.S. PATENT DOCUMENTS

| | | | | |
|---|---|---|---|---|
| 2010/0117176 A1* | 5/2010 | Uekawa | ............... | H04N 23/57 |
| | | | | 257/E31.127 |
| 2013/0320471 A1* | 12/2013 | Luan | ............... | H01L 27/14618 |
| | | | | 257/E31.127 |
| 2018/0006070 A1 | 1/2018 | Isobe | | |

FOREIGN PATENT DOCUMENTS

| | | | |
|---|---|---|---|
| JP | 05-062057 U | | 8/1993 |
| JP | 2001292365 A | * | 10/2001 |
| JP | 2001308302 A | * | 11/2001 |
| JP | 2008-245244 A | | 10/2008 |
| JP | 2008258921 A | | 10/2008 |
| JP | 2009021307 A | * | 1/2009 |
| JP | 05324890 B2 | | 10/2013 |
| WO | 2016/129409 A1 | | 8/2016 |

\* cited by examiner

IMAGING APPARATUS AND MANUFACTURING METHOD OF THE SAME

CROSS REFERENCE TO RELATED APPLICATIONS

This application is a U.S. National Phase of International Patent Application No. PCT/JP2020/037164 filed on Sep. 30, 2020, which claims priority benefit of Japanese Patent Application No. JP 2019-219540 filed in the Japan Patent Office on Dec. 4, 2019. Each of the above-referenced applications is hereby incorporated herein by reference in its entirety.

TECHNICAL FIELD

The present disclosure relates to an imaging apparatus and a manufacturing method thereof. More specifically, the present disclosure relates to an imaging apparatus to which a lens unit on which a filming lens is arranged is coupled and a manufacturing method of the same.

BACKGROUND ART

Imaging apparatuses on which an imaging element and a filming lens are arranged and which are in the modular form have been used to date. As an imaging apparatus in such a modular form, the imaging apparatus including a support and a substrate, for example, has been proposed. A hole used as an imaging optical path is formed in such a manner as to penetrate the support. An imaging chip included in the imaging element is mounted to the substrate (refer, for example, to PTL 1). In the imaging apparatus of this related art, the substrate is attached such that the imaging chip blocks one end of the hole of the support in a hole penetration direction with the imaging chip facing another end of the hole from the one end thereof. Also, an optical member is attached to the other end of the hole in such a manner as to block the hole. Cover glass in the form of a rectangular plate including a transparent glass material is, for example, used as this optical member. The substrate and the optical member are bonded to the support with a thermally curing adhesive. The attachment of the substrate and the optical member to both ends of the hole seals a space in which the imaging element chip is accommodated.

When the substrate is attached to the support, the substrate is bonded with the thermally curing adhesive while aligning the imaging chip. This alignment is performed by adjusting a position of the support in X-, Y-, and Z-axis directions while filming an alignment mark arranged on a front surface of the imaging chip with a CCD camera.

The support to which the substrate and the optical member have been attached is installed to a lens barrel on which the filming lens is arranged. Positioning holes for installation to the lens barrel are formed in the support, and positioning pins are arranged on the lens barrel. At the time of assembly, the positioning pins of the lens barrel are inserted into the positioning holes of the support, after which the support is fastened to the lens barrel. This fastening is performed by tightening screws.

CITATION LIST

Patent Literature

[PTL1]
Japanese Patent Laid-Open No. 2008-245244

SUMMARY

Technical Problem

The above related art has a problem in that alignment accuracy of the imaging element degrades. As described above, the imaging element chip is mounted to the substrate, and the substrate to which this imaging element chip has been mounted is aligned and installed to the support. Because this support is installed to the lens barrel that has been positioned, the imaging chip is aligned through the substrate and the support. This results in multiplication of the respective alignment accuracy of installation to the substrate and the support, which leads to accuracy degradation.

The present disclosure has been made in view of the above problem, and it is an object of the present disclosure to improve the alignment accuracy between the imaging element and the filming lens.

Solution to Problem

The present disclosure has been made to solve the above problem, and a first embodiment thereof is an imaging apparatus that includes an imaging element, a wiring substrate, a sealing section, and fitting sections. The imaging element includes an imaging chip and pads. A light transmission section that transmits incident light is arranged on the imaging chip, and the imaging chip generates an image signal on the basis of the incident light that has transmitted through the light transmission section. The pads are arranged on a bottom surface of the imaging chip which is a surface different from the surface on which the light transmission section is arranged and convey the generated image signal. The wiring substrate includes wiring that is connected to the pads, and the imaging element is arranged on a front surface of the wiring substrate. The sealing section for sealing the imaging chip is arranged adjacent to side surfaces of the imaging chip which are the surfaces adjacent to the bottom surface of the imaging chip. The fitting sections are arranged in the sealing section, and part of a lens unit for forming an optical image on the imaging element is fitted into the fitting sections.

Also, in this first embodiment, the fitting sections may include a recess portion.

Also, in this first embodiment, the fitting sections may include the recess portion that includes a through hole.

Also, in this first embodiment, the fitting sections may include a notch.

Also, in this first embodiment, the fitting sections may include a projection portion.

Also, in this first embodiment, the fitting sections may be formed simultaneously with the sealing section.

Also, in this first embodiment, the sealing section may be arranged adjacent to the side surfaces of the imaging chip on which the wiring substrate is arranged.

Also, in this first embodiment, the sealing section may be further arranged on the side surfaces of the wiring substrate which are the surfaces adjacent to the front surface.

Also, in this first embodiment, the wiring substrate may include wiring that extends into a region outside the imaging element.

Also, in this first embodiment, the wiring substrate may be arranged on the bottom surface of the imaging chip on which the sealing section is arranged.

Also, in this first embodiment, the light transmission section may extend into a region outside the imaging chip, and the sealing section may be arranged adjacent to the light transmission section in the extended region.

Also, in this first embodiment, the sealing section may be arranged adjacent to the side surfaces of the light transmission section which are the surfaces adjacent to the upper surface of the light transmission section onto which the incident light is applied, and the surface of the sealing section onto which the incident light is applied may be in the form of a flat surface that stretches the upper surface.

Also, in this first embodiment, the imaging apparatus may further include a lens unit that forms an optical image on the imaging element, and the fitting sections may fit onto part of the lens unit.

Also, a second embodiment of the present disclosure is a manufacturing method of an imaging apparatus that includes a wiring substrate arrangement step, a sealing step, and a fitting section arrangement step. The wiring substrate arrangement step arranges a wiring substrate on an imaging element. The wiring substrate includes wiring that is connected to pads, and the imaging element is arranged on a front surface of the wiring substrate. The imaging element includes an imaging chip and the pads. A light transmission section that transmits incident light is arranged on the imaging chip, and the imaging chip generates an image signal on the basis of the incident light that has transmitted through the light transmission section. The pads are arranged on a bottom surface of the imaging chip which is a surface different from the surface on which the light transmission section is arranged and convey the generated image signal. The sealing step arranges a sealing section for sealing the imaging chip adjacent to side surfaces of the imaging chip which are the surfaces adjacent to the bottom surface of the imaging chip. The fitting section arrangement step arranges, in the sealing section, fitting sections into which part of a lens unit for forming an optical image on the imaging element is fitted.

The embodiments of the present disclosure have an action of forming, in the sealing section, the fitting sections into which the lens unit fits.

DESCRIPTION OF EMBODIMENTS

Figure 1:
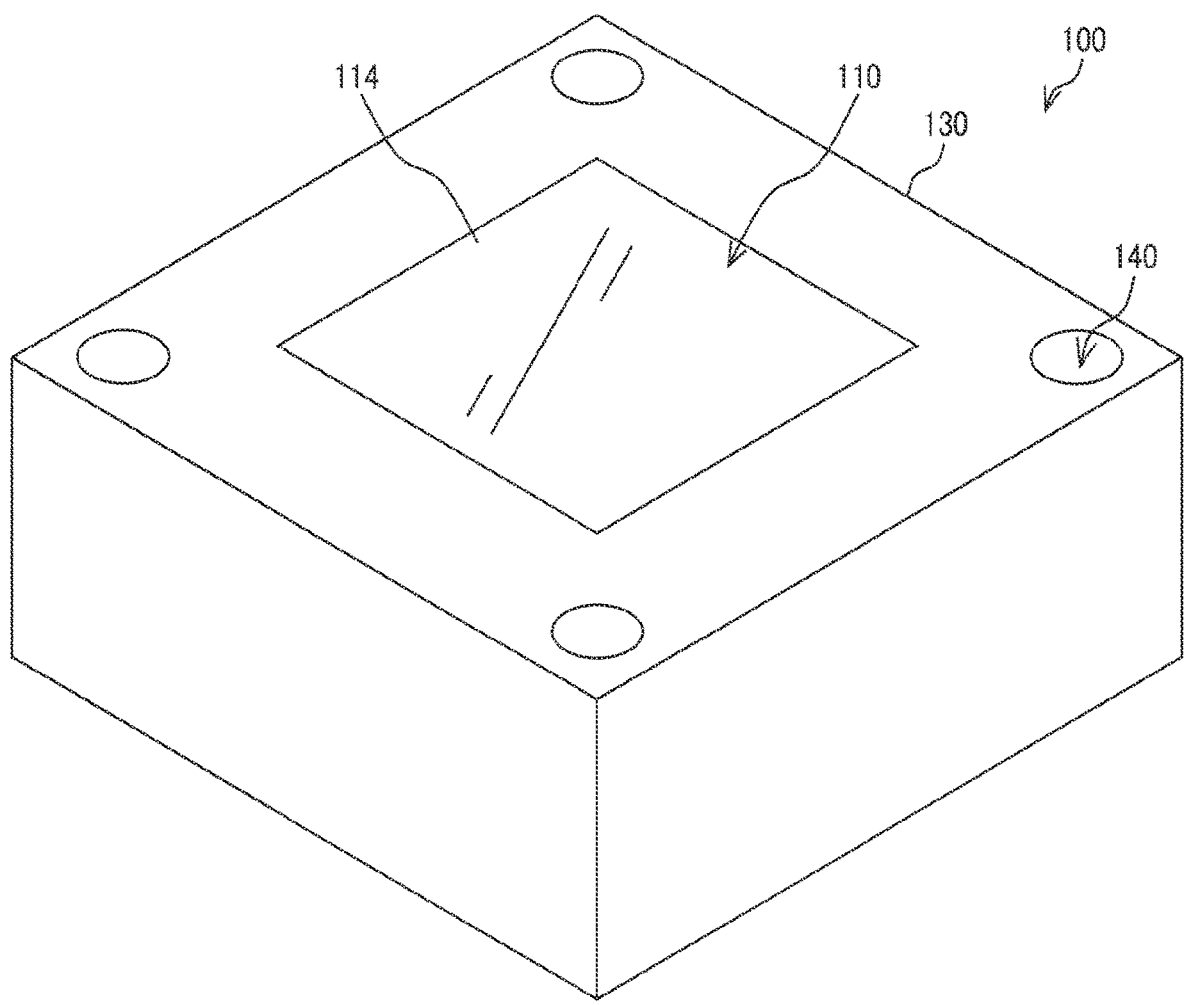
FIG. 1 is a diagram illustrating an example of a configuration of an imaging apparatus according to a first embodiment of the present disclosure.

A description will be given next of modes for carrying out the present disclosure (hereinafter referred to as embodiments) with reference to drawings. In the drawings given below, the same or similar portions will be denoted by the same or similar reference signs. Also, the description will be given in the following order.

1. First embodiment
2. Second embodiment
3. Third embodiment
4. Example of application to camera 1. First Embodiment

[Configuration of Imaging Apparatus]

FIG. 1 is a diagram illustrating an example of a configuration of an imaging apparatus according to a first embodiment of the present disclosure. An imaging apparatus 100 illustrated in FIG. 1 includes a semiconductor package in which an imaging element 110 is sealed by a sealing section 130. As will be described later, an imaging chip (an imaging chip 111 which will be described later) which is a semiconductor chip is arranged inside the imaging element 110. A light transmission section 114 that transmits incident light is arranged on a front surface side of the imaging element 110. The incident light that has transmitted through the light transmission section 114 is applied onto the imaging chip 111. The light transmission section 114 is arranged on an upper surface of the imaging apparatus 100, and the incident light from a subject is applied by a lens unit which will be described later. The imaging apparatus 100 and the lens unit are coupled together and included in an imaging module.

The sealing section 130 illustrated in FIG. 1 is arranged on side surfaces of the imaging element 110. Fitting sections 140 are arranged in the sealing section 130. These fitting sections 140 fit onto part of the lens unit for positioning at the time of installation of the lens unit. FIG. 1 illustrates an example in which the fitting sections 140 in the form of round holes are arranged at four corners of an upper surface of the sealing section 130.

[Cross-Sectional Configuration of Imaging Apparatus]

Figure 2:
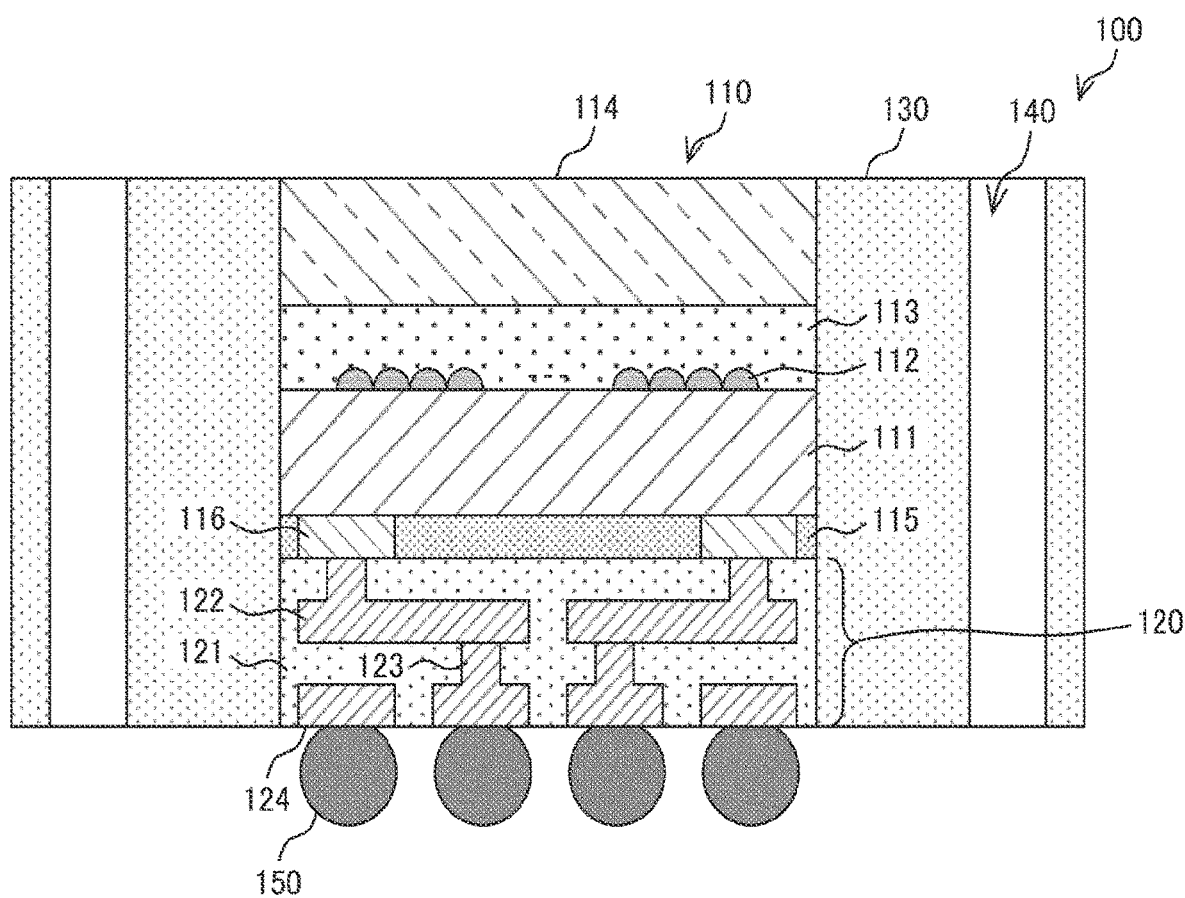
FIG. 2 is a cross-sectional view illustrating an example of a configuration of the imaging apparatus according to the first embodiment of the present disclosure.

FIG. 2 is a cross-sectional view illustrating an example of a configuration of the imaging apparatus according to the first embodiment of the present disclosure. FIG. 2 is a schematic cross-sectional view illustrating an example of a configuration of the imaging apparatus 100 and a schematic cross-sectional view along a diagonal of the upper surface of the imaging apparatus 100 illustrated in FIG. 1. The imaging apparatus 100 illustrated in FIG. 2 includes the imaging element 110, a wiring substrate 120, the sealing section 130, the fitting sections 140, and connection sections 150.

The imaging element 110 is a semiconductor element that generates an image signal on the basis of incident light. The imaging element 110 includes the imaging chip 111, an insulating film 115, pads 116, an adhesive 113, and the light transmission section 114.

The imaging chip 111 is a semiconductor chip that generates an image signal on the basis of incident light. The imaging chip 111 includes a plurality of pixels that generate image signals on the basis of the incident light. A photoelectric conversion section and a pixel circuit are arranged in these pixels. The photoelectric conversion section converts light into electric charge commensurate with incident light. The pixel circuit generates an image signal on the basis of the electric charge generated by the photoelectric conversion. The imaging chip 111 includes the plurality of pixels arranged in a two-dimensional grid pattern on a light-receiving surface onto which the incident light is applied. Also, an on-chip lens 112 is arranged on each of these pixels. These on-chip lenses 112 are lenses in the semi-circular form that concentrate the incident light onto the photoelectric conversion section. As illustrated in FIG. 2, these on-chip lenses 112 are arranged on the light-receiving surface of the imaging chip 111. The photoelectric conversion section and the like are formed inside the imaging chip 111.

The insulating film 115 is a film arranged on a rear surface of the imaging chip 111 which is the surface different from the light-receiving surface of the imaging chip 111 and insulates the rear surface of the imaging chip 111. The insulating film 115 can include, for example, an insulator film such as silicon oxide ($SiO_2$). The insulating film 115 can also include resin such as solder resist.

The pads 116 are electrodes arranged in the imaging chip 111 to convey signals such as image signals generated by the pixel. These pads 116 are arranged on the rear surface of the imaging chip 111 and are in the form embedded in the above insulating film 115. In addition to the image signals, control signals, power, and the like are also conveyed through the pads 116. The plurality of such pads 116 is arranged on the bottom surface of the imaging chip 111 and included in input and output terminals of the imaging chip 111. The pads 116 can include, for example, metal such as copper (Cu) or gold (Au). It should be noted that the pads 116 are connected to the above pixel circuit and the like by wiring formed inside the imaging chip 111.

The adhesive 113 is arranged adjacent to the light-receiving surface of the imaging chip 111 and bonds together the imaging chip 111 and the light transmission section 114 which will be described later. A transparent resin can be used as the adhesive 113.

The light transmission section 114 transmits the incident light. The incident light is applied onto the upper surface of the light transmission section 114 illustrated in FIG. 2. Also, the light transmission section 114 further protects the imaging chip 111. The light transmission section 114 can include a transparent member such as glass or resin.

The wiring substrate 120 is a substrate which has a front surface in which the imaging element 110 is incorporated. The wiring substrate 120 includes a wiring layer 122 and an insulating layer 121. The wiring layer 122 is wiring that conveys the signals of the imaging element 110. The wiring layer 122 illustrated in FIG. 2 is connected to the pads 116 of the imaging element 110 and conveys image signals and the like. The wiring layer 122 can include, for example, metal such as Cu, Au, nickel (Ni), chrome (Cr), and palladium (Pd). Also, the wiring layer 122 can be formed by plating.

The insulating layer 121 insulates the wiring layer 122. The insulating layer 121 can include, for example, epoxy resin, polyimide resin, acrylic resin, phenol resin, and the like. The wiring layer 122 and the insulating layer 121 can be formed in multiple layers. FIG. 2 illustrates an example in which the wiring layer 122 and the insulating layer 121 are formed in two layers. The wiring layers 122 arranged in different layers can be connected through vias 123. It should be noted that wiring substrate pads 124 are arranged on the rear surface of the wiring substrate 120. These wiring substrate pads 124 are connected to the pads 116 of the imaging chip 111 through the wiring layer 122 and the vias 123. Also, the connection sections 150 which will be described later are joined to the wiring substrate pads 124.

The wiring substrate 120 is arranged on the rear surface of the imaging chip 111. This can be performed, for example, by pasting the wiring substrate 120 to the rear surface of the imaging chip 111. Specifically, this can be performed by joining the wiring layer 122 of the wiring substrate 120 to the pads 116 of the imaging chip 111. Soldering, for example, can be used for this joining. Also, the arrangement of the wiring substrate 120 can be performed by forming the wiring substrate 120 on the rear surface of the imaging chip 111. Specifically, a film of the insulating layer 121 is formed on the rear surface of the imaging chip 111, after which opening portions are formed in the insulating layer 121 at the positions where the vias 123 are formed, that is, at the positions adjacent to the pads 116. Next, a metal film which is used as the material of the wiring layer 122 is arranged adjacent to the insulating layer 121. This can be performed, for example, by plating. At this time, the metal film which is used as the material of the wiring layer 122 is also arranged in the opening portions of the insulating layer 121. Next, the wiring layer 122 is formed by patterning this metal film. The wiring substrate 120 can be arranged on the rear surface of the imaging chip 111 by repeating this formation of the insulating layer 121 and the wiring layer 122.

The sealing section 130 seals the imaging element 110. The sealing section 130 illustrated in FIG. 2 is arranged adjacent to the side surfaces of the imaging element 110 and seals the side surfaces thereof. Also, the sealing section 130 is arranged also adjacent to the side surfaces of the wiring substrate 120. The sealing section 130 can include epoxy resin, polyimide resin, and the like. Also, a filler can be dispersed in these resins to improve strength of the sealing section 130.

The sealing section 130 illustrated in FIG. 2 is arranged adjacent to the side surfaces of the light transmission section 114, and the upper surface of the sealing section 130 is in the form of a flat surface that stretches over the upper surface of the light transmission section 114. This ensures that the upper surface of the imaging apparatus 100 is in the form of a single flat surface.

The fitting sections 140 fit onto part of the lens unit for positioning at the time of the installation of the lens unit as described above. These fitting sections 140 are arranged in the sealing section 130, fit onto part of the lens unit, and fasten the position of the lens unit. The fitting sections 140 can include, for example, a recess portion formed in the sealing section 130. The fitting sections 140 illustrated in FIG. 2 illustrate the fitting sections 140 that include a through hole as an example of the recess portion of the sealing section 130.

The connection sections 150 are arranged on the rear surface of the wiring substrate 120 and connected to the wiring substrate pads 124. These connection sections 150 convey signals such as image signals and are included in the terminals of the imaging element 110. The connection sections 150 can include metal such as solder ball.

It should be noted that the imaging element 110 in FIG. 2 illustrates an example in which the light transmission section 114 and the wiring substrate 120 are substantially in the same planar size as the imaging chip 111.

[Cross-Sectional Configuration of Imaging Module]

Figure 3:
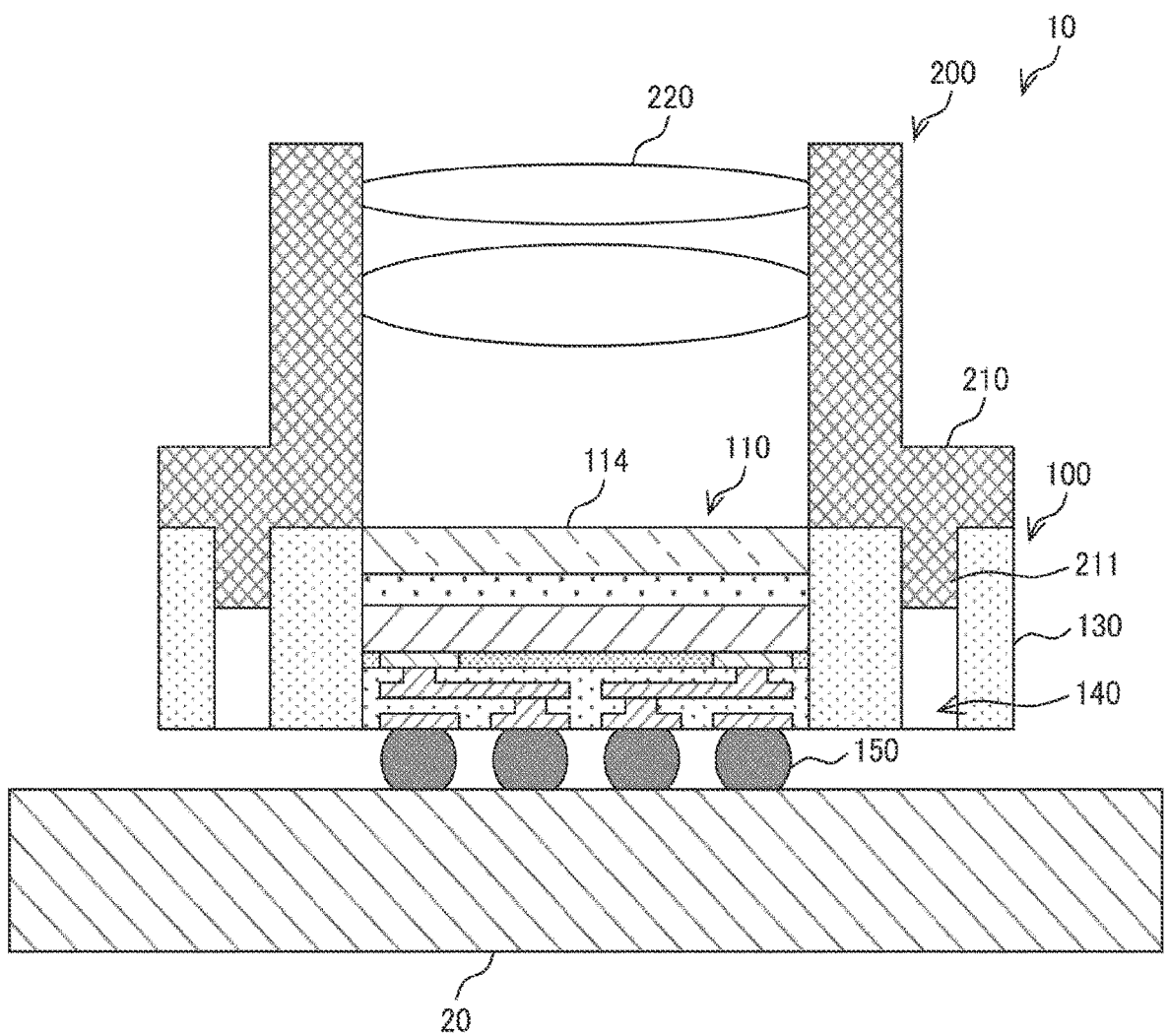
FIG. 3 is a cross-sectional view illustrating an example of a configuration of an imaging module according to the first embodiment of the present disclosure.

FIG. 3 is a cross-sectional view illustrating an example of a configuration of an imaging module according to the first embodiment of the present disclosure. FIG. 3 is a cross-sectional view illustrating an example of a configuration of an imaging module 10. The imaging module 10 illustrated in FIG. 3 includes the imaging apparatus 100 and a lens unit 200. Also, the imaging module 10 illustrated in FIG. 3 is mounted to a substrate 20.

The lens unit 200 includes a lens barrel 210 and an imaging lens 220. The lens barrel 210 holds the imaging lens. The imaging lens 220 forms an image of a subject on the imaging element 110. The plurality of imaging lenses 220 can be arranged in the lens barrel 210. Also, an actuator for driving the imaging lens and adjusting focus can be arranged in the lens barrel 210. Projection portions 211 are arranged on a bottom portion of the lens barrel 210. These projection portions 211 are inserted into the fitting sections 140 of the imaging apparatus 100, which causes the lens unit 200 to be positioned in the imaging apparatus 100.

It is possible to perform positioning in the X- and Y-axis directions by aligning the relative positions of the plurality of fitting sections 140 with respect to a center of the imaging element 110 in the imaging apparatus 100 with the relative positions of the plurality of projection portions 211 with respect to an optical axis of the imaging lens 220 in the lens unit 200. Also, as described above, it is possible to reduce a deviation in a tilt direction which is a misalignment in rotation directions along the X and Y axes by configuring the upper surface of the imaging element 110 (the transmission section 114) and the upper surface of the sealing section 130 in the same flat surface. At this time, it is a matter of course that the imaging lens 220 is arranged parallel to the bottom surface of the lens unit 200. This positioning allows the imaging lens 220 to form the subject image at the center of the light-receiving surface of the imaging chip 111 of the imaging element 110. It should be noted that the positioning in the Z-axis direction can be performed by adjusting the position of the imaging lens 220.

It should be noted that the imaging apparatus 100 of the first embodiment of the present disclosure is not limited in configuration to this example. For example, the fitting sections 140 can be arranged at three corner portions of the upper surface of the sealing section 130. Also, the fitting sections 140 can also be arranged at portions of the sealing section 130 other than the corner portions.

Figure 4A:
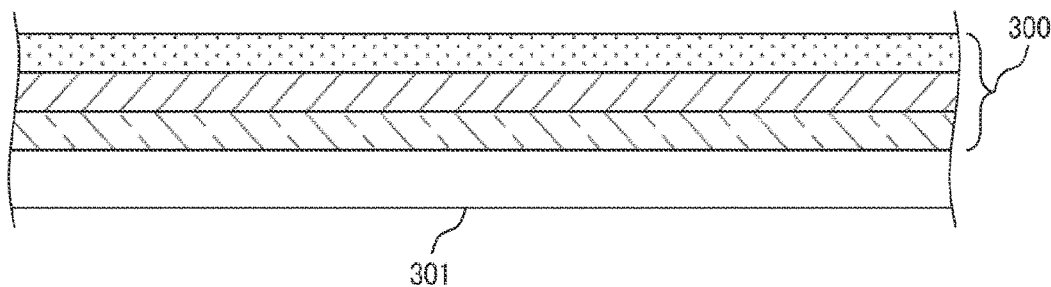
FIGS. 4A, 4B, 4C, and 4D illustrate an example of diagrams of a manufacturing method of the imaging apparatus according to the first embodiment of the present disclosure.
Figure 4B:
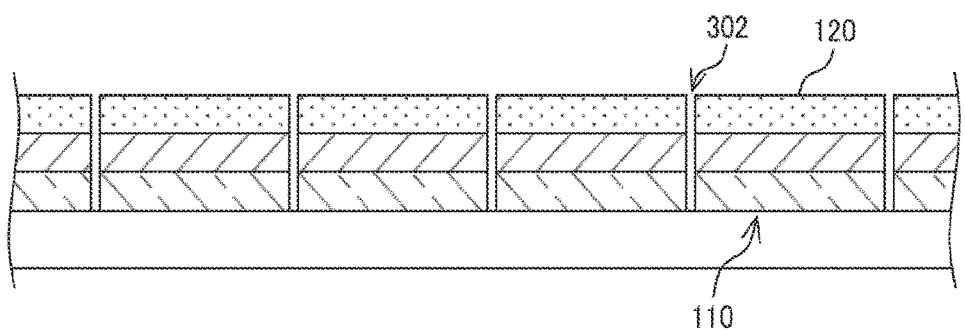

[Manufacturing method of imaging apparatus] FIGS. 4A, 4B, 4C, 4D, 5A, 5B. 5C, and 5D illustrate an example of diagrams of a manufacturing method of the imaging apparatus according to the first embodiment of the present disclosure. FIGS. 4A, 4B, 4C, 4D, 5A, 5B, 5C, and 5D illustrate an example of diagrams of manufacturing steps of the imaging apparatus 100. First, an imaging element 300 in the form of a semiconductor wafer is formed. The imaging element 300 is formed by pasting a glass plate included in the light transmission section 114 to the light-receiving surface of the semiconductor wafer on which the plurality of imaging chips is formed by using the adhesive 113 (not illustrated) and arranging the wiring substrate 120 on the rear surface. The imaging element 300 is stuck to a dicing tape 301 (FIG. 4A). Next, the imaging element 300 is diced. The imaging element 300 is singulated into the individual imaging elements 110 in plural number by forming trenches 302 in the imaging element 300 with a dicing blade (FIG. 4B). This makes it possible to manufacture the imaging elements 110 on which the wiring substrate 120 is arranged. The step in question is an example of the wiring substrate arrangement step defined in the claims.

Figure 4C:
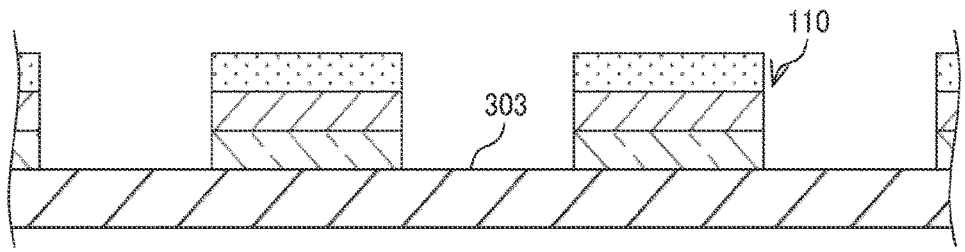

Next, the singulated imaging elements 110 are rearranged on a resin molding sheet 303. This rearrangement rearranges the imaging elements 110 with relatively high position accuracy with respect to the fitting sections 140 which will be formed in the subsequent step. At the time of this rearrangement, the side of the imaging elements 110 on which the light transmission section 114 is arranged is stuck to the resin molding sheet 303 (FIG. 4C).

Figure 4D:
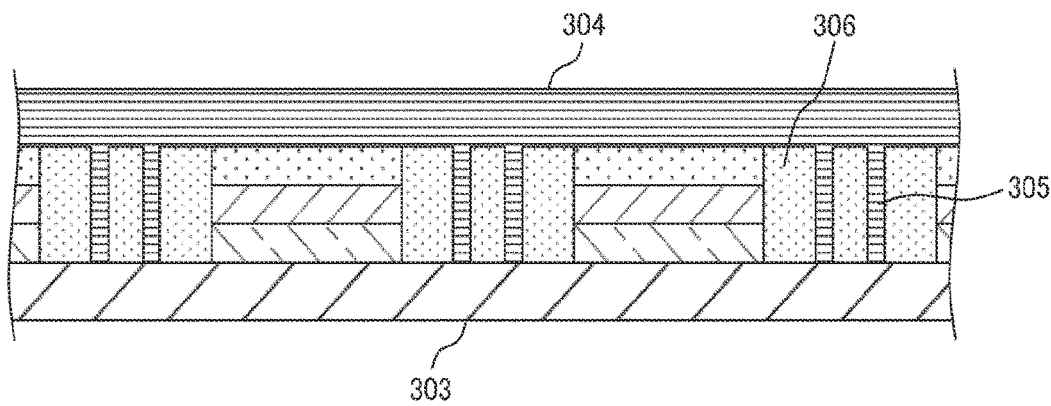
Figure 5A:
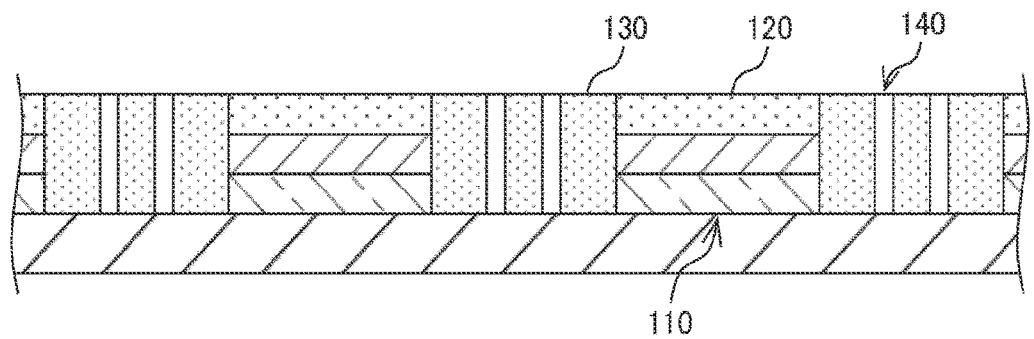
FIGS. 5A, 5B, 5C, and 5D illustrate the example of diagrams of the manufacturing method of the imaging apparatus according to the first embodiment of the present disclosure.

Next, a mold 304 is arranged adjacent to the imaging elements 110 and the resin molding sheet 303. Pins 305 are arranged at the positions of the mold 304 where the fitting sections 140 will be formed. Next, resin 306 which is used as the material of the sealing section 130 is arranged between the mold 304 and the resin molding sheet 303. This can be performed by pouring the resin 306 between the mold 304 and the resin molding sheet 303 and curing the resin 306 (FIG. 4D). Next, the mold 304 is removed. This makes it possible to arrange the sealing section 130 on the side surfaces of the imaging elements 110 and seal the imaging elements 110 (FIG. 5A). The step in question is an example of the sealing step defined in the claims. Also, the fitting sections 140 are formed and arranged at the positions of the pins 305 of the mold 304. The step in question is an example of the fitting section arrangement step defined in the claims.

Figure 5B:
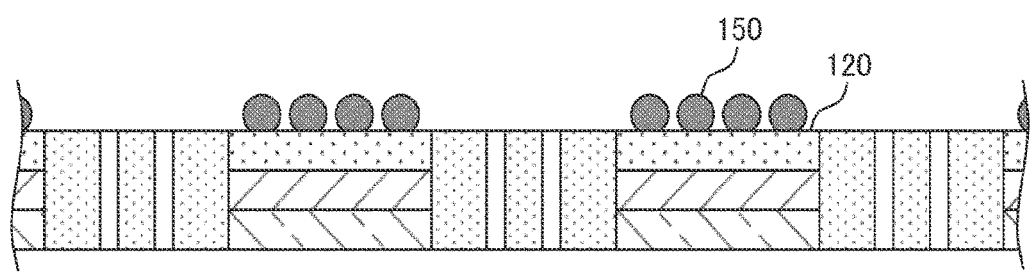

Next, the resin molding sheet 303 is removed, and the connection sections 150 are arranged on the wiring substrate pads 124 (not illustrated) of the wiring substrate 120. This can be performed by soldering the connection sections 150 to the wiring substrate pads 124 (FIG. 5B). This makes it possible to form the imaging apparatuses 100 in plural number that are coupled by the sealing section 130.

Figure 5C:
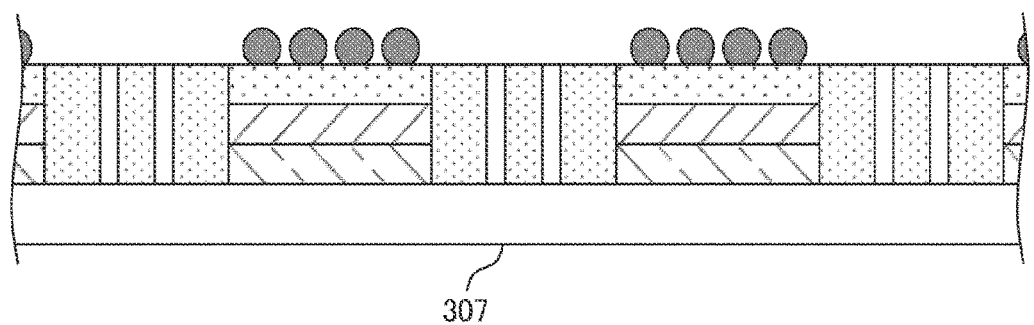

Next, the imaging apparatuses 100 in plural number that are coupled by the sealing section 130 are stuck to the dicing tape 307 (FIG. 5C).

Figure 5D:
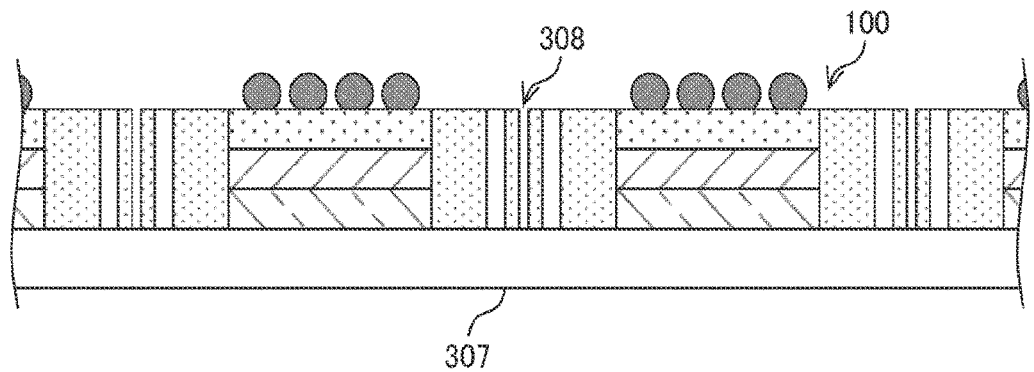

Next, the imaging apparatuses 100 are singulated by forming trenches 308 in the sealing section 130 by dicing (FIG. 5D). Next, the dicing tape 307 is removed. This makes it possible to manufacture the imaging apparatuses 100. The manufacturing method described above illustrates an example of forming the sealing section 130 and the fitting sections 140 simultaneously.

Figure 6A:
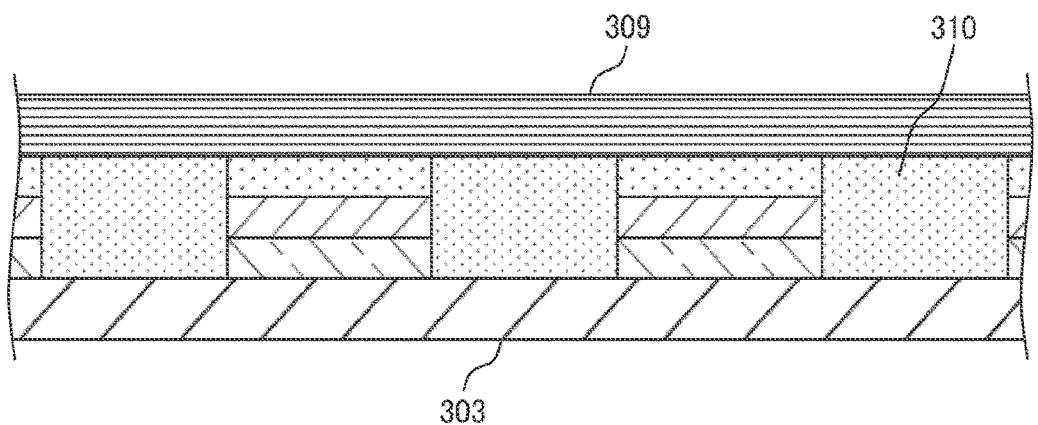
FIGS. 6A, 6B, and 6C illustrate the example of diagrams of another manufacturing method of the imaging apparatus according to the first embodiment of the present disclosure.
Figure 6B:
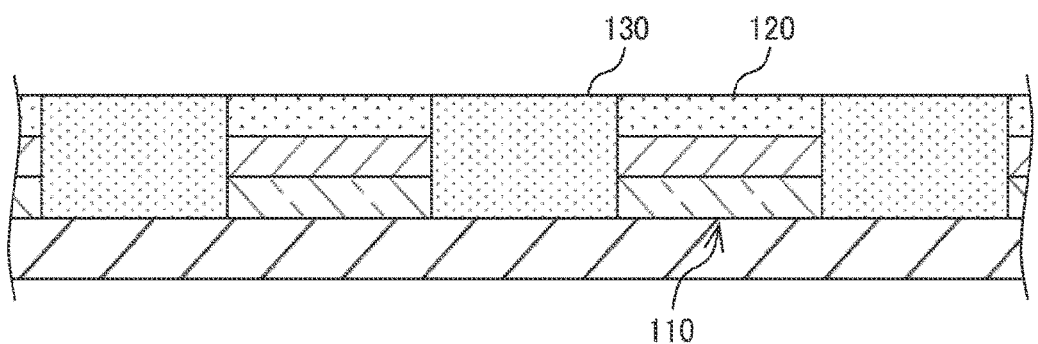
Figure 6C:
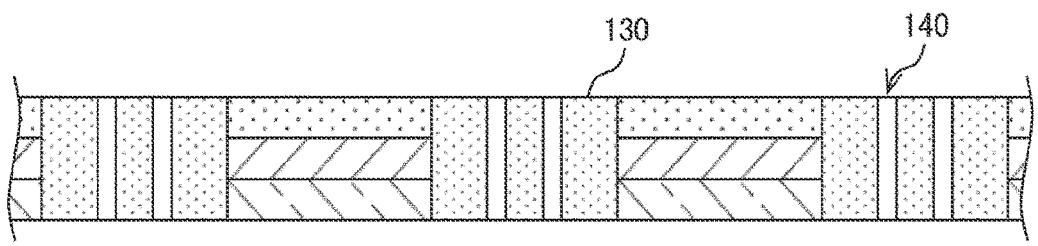

[Other manufacturing method of imaging apparatus] FIGS. 6A, 6B, and 6C illustrate an example of diagrams of another manufacturing method of the imaging apparatus according to the first embodiment of the present disclosure. FIGS. 6A, 6B, and 6C illustrate diagrams of manufacturing steps of the imaging apparatus 100, and this step is performed in place of the steps in FIG. 4D and FIG. 5A.

First, a mold 309 is arranged adjacent to the imaging elements 110 and the resin molding sheet 303. Unlike the mold 304 described in FIG. 4D, the mold 309 is a mold on which the pins 305 are not arranged at the positions where the fitting sections 140 will be formed. Next, the imaging elements 110 are sealed by arranging resin 310 which is used as the material of the sealing section 130 between the mold 309 and the resin molding sheet 303 (FIG. 6A). The step in question is an example of the sealing step defined in the claims.

Next, the mold 309 is removed (FIG. 6B). Next, the fitting sections 140 are arranged in the sealing section 130. This can be performed by forming through holes included in the fitting sections 140 in the sealing section 130 (FIG. 6C). This formation of the through holes can be performed, for example, by applying a laser beam. At this time, the through holes are formed after measuring the positions of the imaging elements 110 and acquiring the relative positions where the fitting sections 140 will be formed with respect to the imaging elements 110. This makes it possible to improve the accuracy of the positions of the fitting sections 140.

It should be noted that the manufacturing method of the imaging apparatus 100 is not limited to this example. The entire imaging elements 110 including the light transmission section 114 can be sealed by arranging the side of wiring substrate 120 of the imaging elements 110 on the resin molding sheet 303. In this case, the sealing section 130 is ground after the sealing in such a manner as to expose the surface of the light transmission section 114 on the front surface. At this time, the imaging apparatus 100 can be reduced in height by further grinding the light transmission section 114.

Modification Example

Although the fitting sections 140 that include a through hole are arranged in the above imaging apparatus 100, the fitting sections in a different form may be arranged.

Figure 7A:
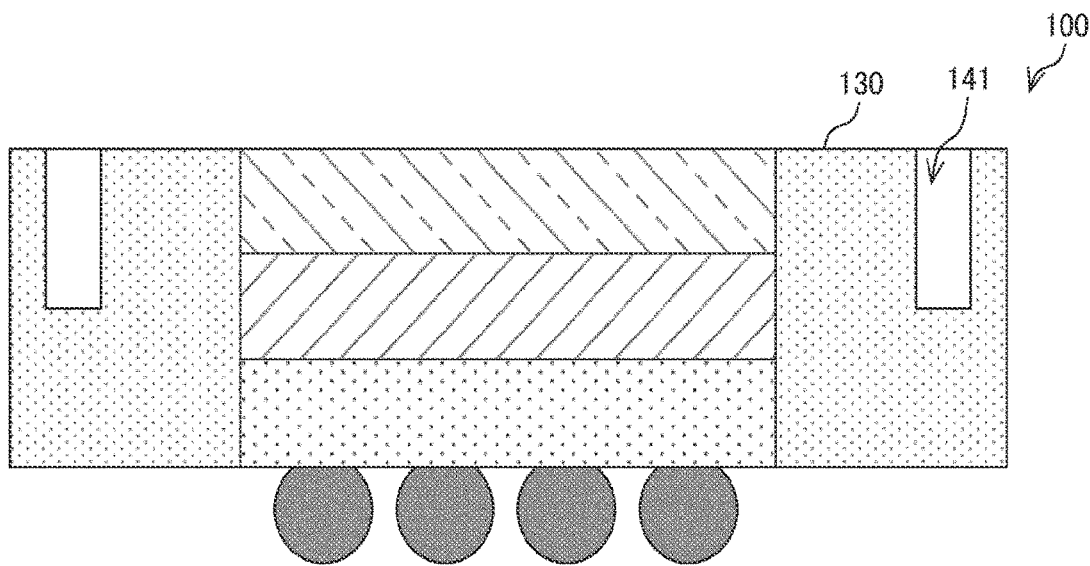
FIGS. 7A and 7B illustrate an example of cross-sectional views of a configuration of an imaging apparatus according to a modification example of the first embodiment of the present disclosure.
Figure 7B:
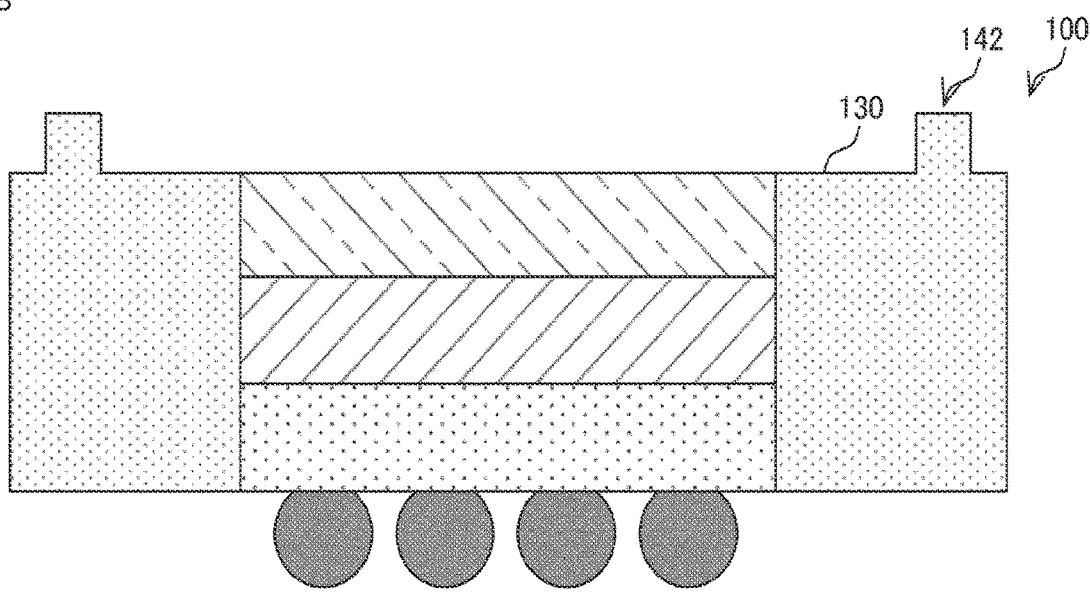

FIGS. 7A and 7B illustrate an example of cross-sectional views of a configuration of an imaging apparatus according to a modification example of the first embodiment of the present disclosure. FIGS. 7A and 7B illustrate an example of diagrams of a configuration of the imaging apparatus 100 as in FIG. 2. In FIGS. 7A and 7B, representations of the wiring substrate 120 and the like are simplified in FIGS. 7A and 7B.

FIG. 7A is a diagram illustrating an example of fitting sections 141 that include a recess portion. The fitting sections 141 illustrated in FIG. 7A include a round hole that does not penetrate the sealing section 130 and can have a depth that allows the projection portion 211 of the lens barrel 210 described in FIG. 3 to be inserted thereinto.

FIG. 7B is a diagram illustrating an example of fitting sections 142 that include a projection portion. The fitting sections 142 illustrated in FIG. 7B are in the cylindrical form, and round holes are formed in the lens barrel 210 of the lens unit 200 that fits onto these fitting sections 142.

Figure 8A:
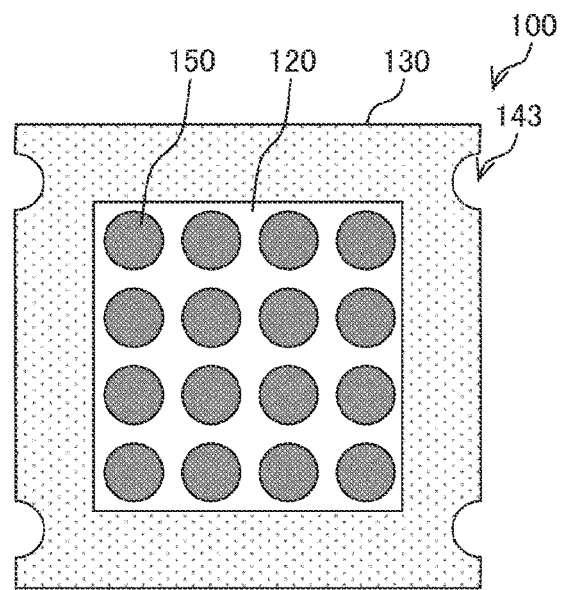
FIGS. 8A and 8B illustrate another configuration example of diagrams of the imaging apparatus according to the modification example of the first embodiment of the present disclosure.
Figure 8B:
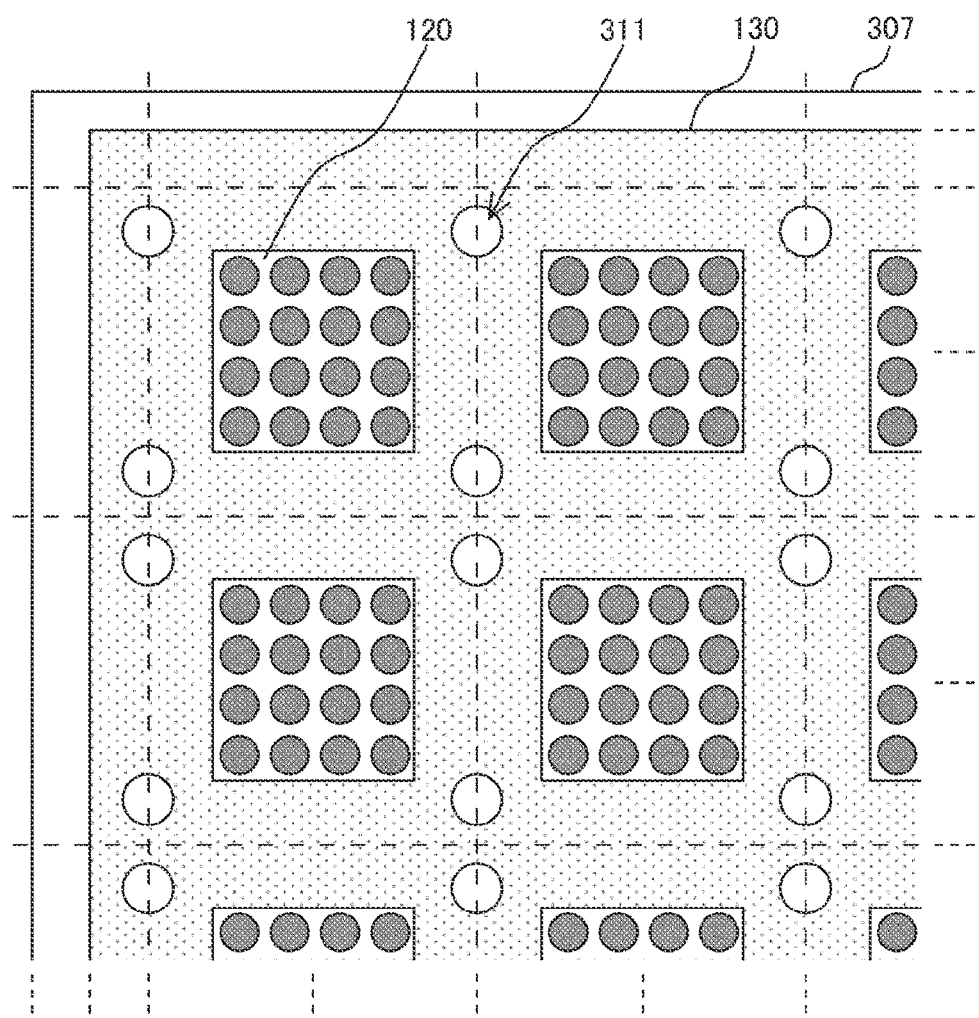

FIGS. 8A and 8B illustrate another configuration example of diagrams of the imaging apparatus according to the modification example of the first embodiment of the present disclosure. FIG. 8A is a bottom view of the imaging apparatus 100 and a diagram illustrating an example of the imaging apparatus 100 in which fitting sections 143 that include a notch are arranged. The rear surface of the wiring substrate 120 is arranged on the bottom surface of the imaging apparatus 100 in FIG. 8A. The fitting sections 143 are arranged in the vicinity of the corner portions of the sealing section 130. These fitting sections 143 are corresponding to the form obtained by cutting the fitting section 140 into halves and can be smaller in size than the fitting sections 140. Accordingly, it is possible to reduce the regions where the fitting sections 140 are arranged, which makes it possible to reduce a thickness of the sealing section 130 on the outside of the wiring substrate 120. It should be noted that although the imaging apparatus 100 in FIG. 8A illustrates an example in which the connection sections 150 are arranged in four rows and five columns, this example is not intended to limit the number of connection sections 150 and the like.

FIG. 8B is a diagram illustrating a manufacturing method of the fitting sections 143. FIG. 8B is a plan view illustrating a configuration of the plurality of imaging apparatuses 100 stuck to the dicing tape 307 described in FIG. 5C. Dotted lines in FIG. 8B illustrate the positions where the sealing section 130 is to be cut by the dicing blade. Prior to the dicing, through holes 311 are formed in the sealing section 130. These through holes 311 are arranged at the positions where they straddle two halves of the cut sealing section 130. It is possible to form the fitting sections 143 that are semi-circular in plan view by dicing and singulating these imaging apparatuses 100.

It should be noted that the configuration of the imaging apparatus 100 is not limited to this example. For example, the fitting sections 143 can include a notch in a different form such as rectangle.

As described above, the fitting sections 140 are arranged in the surface of the sealing section 130 of the imaging apparatus 100 which is coupled to the lens unit 200 for alignment in the imaging apparatus 100 of the first embodiment of the present disclosure. This makes it possible to improve the alignment accuracy between the imaging apparatus 100 and the lens unit 200.

2. Second Embodiment

In the imaging apparatus 100 of the above first embodiment, the wiring substrate 120 having the same size as the imaging elements 110 is used. In contrast, the imaging apparatus 100 of a second embodiment differs from that of the above first embodiment in that the wiring substrate larger in size than the imaging elements 110 is used.

[Cross-Sectional Configuration of the Imaging Apparatus]

Figure 9:
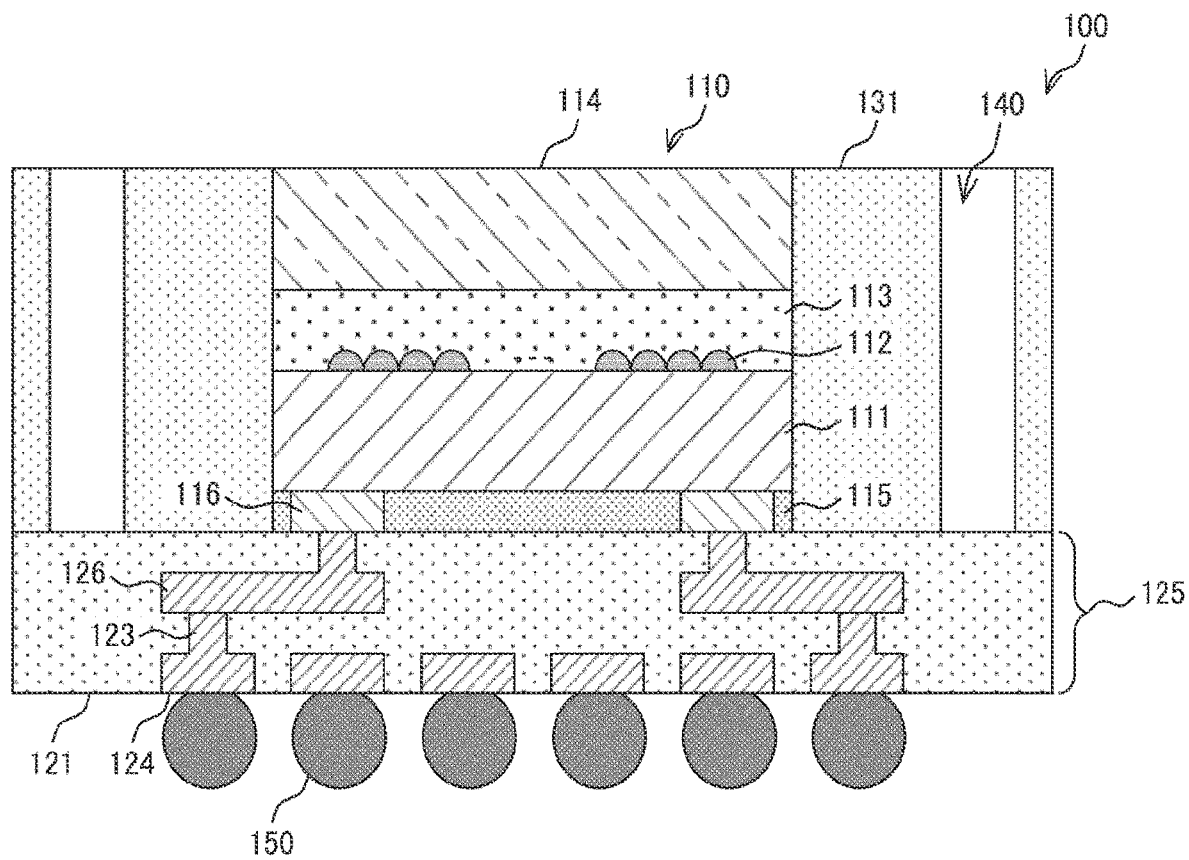
FIG. 9 is a cross-sectional view illustrating an example of a configuration of an imaging apparatus according to a second embodiment of the present disclosure.

FIG. 9 is a cross-sectional view illustrating an example of a configuration of imaging apparatus according to the second embodiment of the present disclosure. FIG. 9 is a schematic cross-sectional diagram illustrating an example of a configuration of the imaging apparatus 100 as is FIG. 2. The imaging apparatus 100 differs from the imaging apparatus 100 illustrated in FIG. 2 in that a wiring substrate 125 and a sealing section 131 are arranged in place of the wiring substrate 120 and the sealing section 130.

The wiring substrate 125 is a wiring substrate larger in size than the imaging elements 110. The wiring substrate 125 in FIG. 9 illustrates an example in which the wiring substrate 125 is in the form that occupies the entire bottom portion of the imaging apparatus 100. A wiring layer 126 is arranged in the wiring substrate 125. The wiring layer 126 is wiring that extends into a region outside the imaging elements 110. Specifically, the wiring layer 126 connects the pads 116 arranged on the rear surface of the imaging chip 111 to the wiring substrate pads 124 arranged in the wiring substrate 125 in the region outside the imaging elements 110. That is, the positions of the pads 116 of the imaging chip 111 are rearranged in the form expanded to the region of the sealing section 131 which will be described later. Such a semiconductor package is called a Fan Out Wafer Level Package (FOWLP) and is a package applicable to a semiconductor chip that includes more pads than a CSP (Chip Size Package) does.

The sealing section 131 is a sealing section that is arranged adjacent to the side surfaces of the imaging elements 110 and is arranged adjacent to the wiring substrate 125 in the region outside the imaging elements 110. The fitting sections 140 are formed in the sealing section 131 as in the sealing section 130. These fitting sections 140 allow alignment with the lens unit 200.

In the imaging apparatus 100 illustrated in FIG. 9, the wiring substrate pads 124 can be arranged substantially over the entire surface of the wiring substrate 125. In this case, the fitting sections 140 can be arranged in gaps between the wiring substrate pads 124. It is possible to reduce the sealing section 131 in the regions where the fitting sections 140 are arranged as compared to the imaging apparatus 100 illustrated in FIG. 2, which makes it possible to downsize the imaging apparatus 100.

[Manufacturing method of imaging apparatus] FIGS. 10A, 10B, 10C, 10D, 10E, 11A, 11B, 11C, and 11D illustrate an example of diagrams of a manufacturing method of the imaging apparatus according to the second embodiment of the present disclosure. FIGS. 10A, 10B, 10C, 10D, 10E, 11A, 11B, 11C, and 11D illustrate an example of diagrams of manufacturing steps of the imaging apparatus 100 as are FIGS. 6A, 6B, 6C, 7A, and 7B. These manufacturing steps differ from those illustrated in FIGS. 6A, 6B, 60, 7A, and 7B in that the wiring substrate 125 is arranged after the sealing of the imaging elements 110.

Figure 10A:
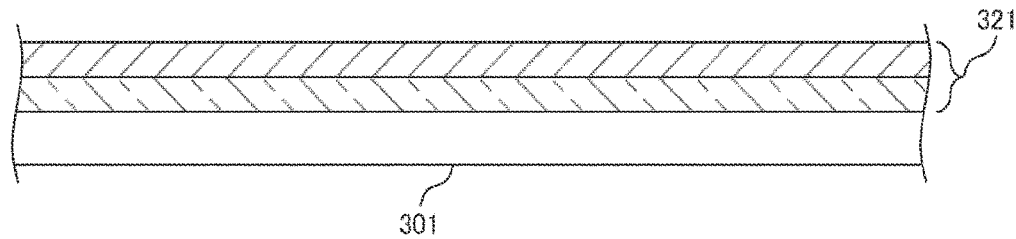
FIGS. 10A, 10B, 10C, 10D, and 10E illustrate an example of diagrams of a manufacturing method of the imaging apparatus according to the second embodiment of the present disclosure.

First, an imaging element 321 in the form of a semiconductor wafer is formed. The imaging element 321 is formed by pasting a glass plate included in the light transmission section 114 to the light-receiving surface of the semiconductor wafer on which the plurality of imaging chips is formed by using the adhesive 113 (not illustrated). The imaging element 321 is stuck to the dicing tape 301 (FIG. 10A).

Figure 10B:
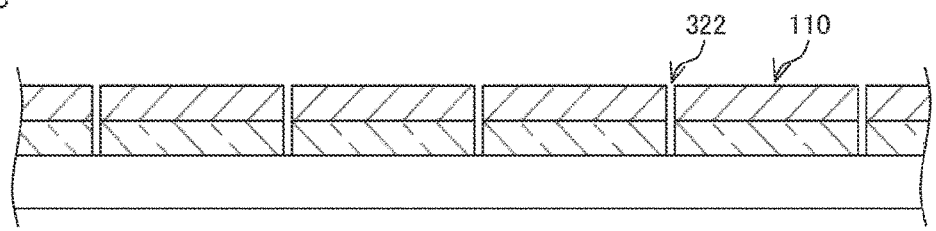

Next, the imaging element 321 is diced by forming trenches 322 in the imaging element 321 with the dicing blade. The imaging element 321 is singulated into the individual imaging elements 110 in plural number (FIG. 10B).

Figure 10C:
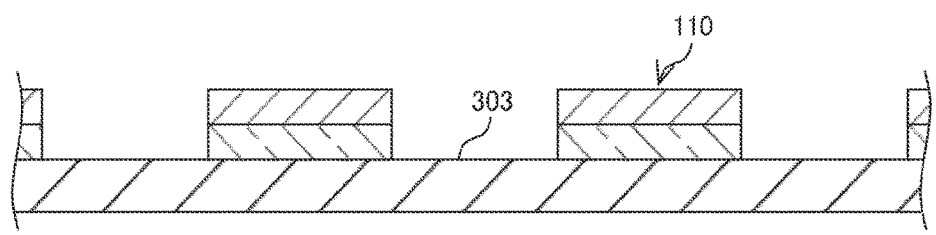

Next, the singulated imaging elements 110 are rearranged on the resin molding sheet 303. The side of the imaging elements 110 on which the light transmission section 114 is arranged is stuck to the resin molding sheet 303 (FIG. 10C).

Figure 10D:
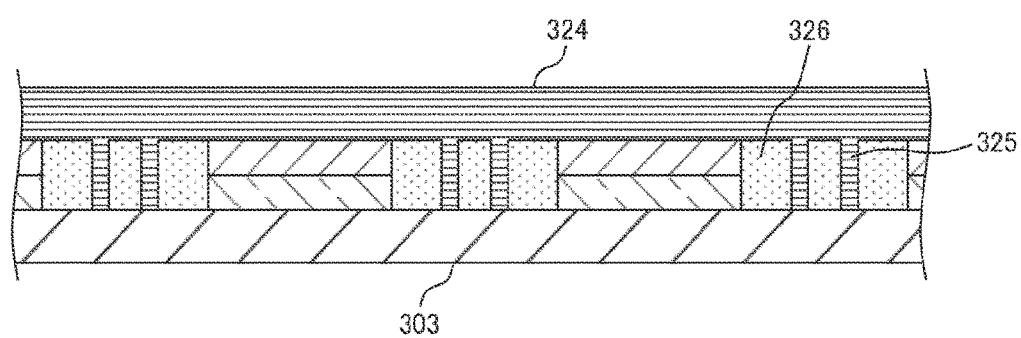
Figure 10E:
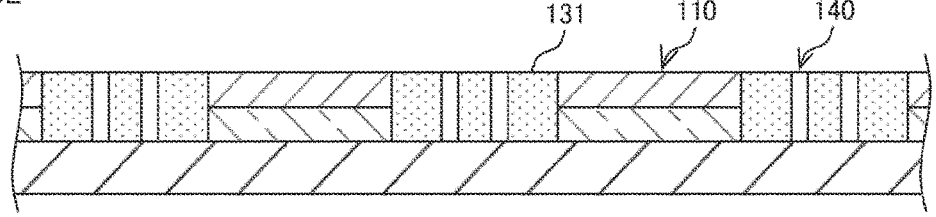

Next, a mold 324 is arranged adjacent to the imaging elements 110. Pins 325 are arranged at the positions of the mold 324 where the fitting sections 140 will be formed. Next, resin 326 which is used as the material of the sealing section 131 is poured between the mold 324 and the resin molding sheet 303 and cured (FIG. 10D). Next, the mold 324 is removed. This makes it possible to arrange the sealing section 131 adjacent to the side surfaces of the imaging elements 110 and the wiring substrate 125 in the region outside the imaging elements 110. It is possible to seal the imaging elements 110 (FIG. 10E). The step in question is an example of the sealing step defined in the claims. Also, the fitting sections 140 are formed and arranged at the positions of the pins 325 of the mold 324. The step in question is an example of the fitting section arrangement step defined in the claims.

Figure 11A:
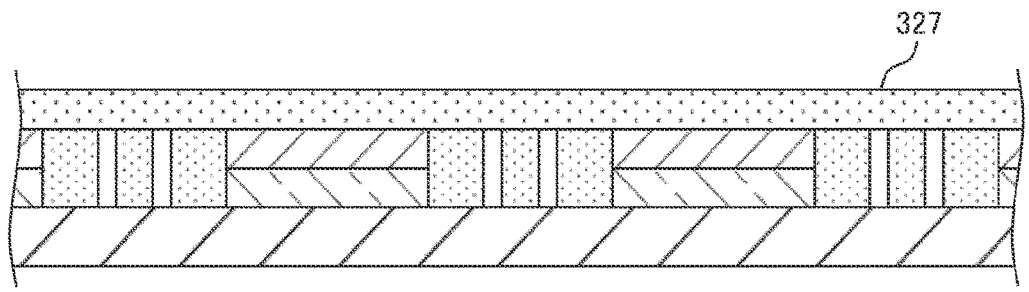
FIGS. 11A, 11B, 11C, and 11D illustrate the example of diagrams of the manufacturing method of the imaging apparatus according to the second embodiment of the present disclosure.

Next, a wiring substrate 327 is arranged on the rear surface of the imaging elements 110 (FIG. 11A). The wiring substrate 327 is a wiring substrate in which the plurality of wiring substrates 125 is formed. This arrangement of the wiring substrate 327 can be performed by joining the wiring substrate 327 such as a buildup substrate formed in another manufacturing step to the imaging elements 110. Also, the arrangement of the wiring substrate 327 can also be performed by forming the wiring substrate 327 by stacking the insulating layer 121 and the wiring layer 126 in this order on the rear surface of the imaging elements 110. The step in question is an example of the wiring substrate arrangement step defined in the claims.

Figure 11B:
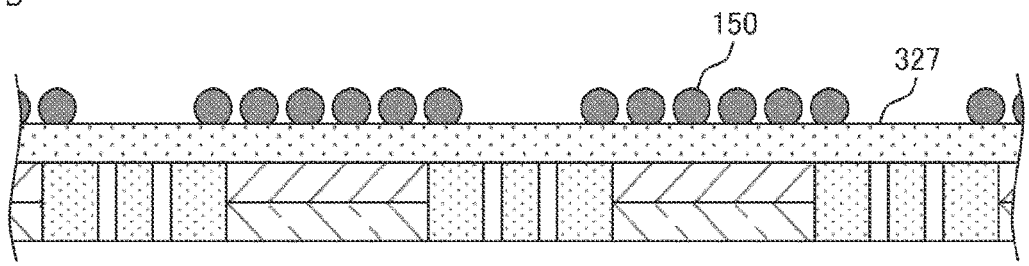
Figure 11C:
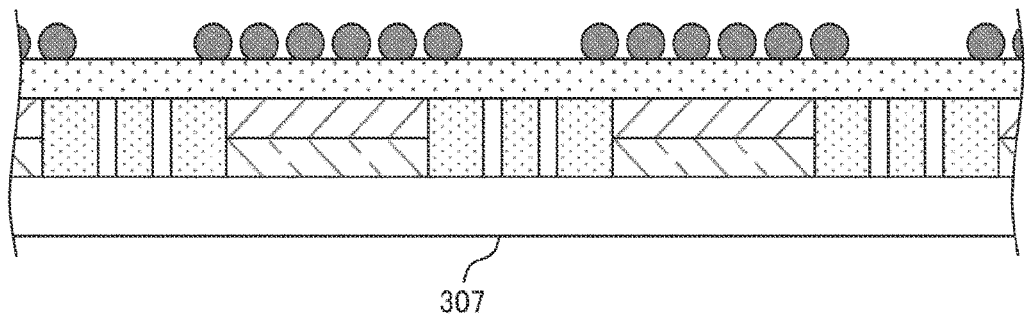

Next, the resin molding sheet 303 is removed, and the connection sections 150 are arranged on the wiring substrate pads 124 of the wiring substrate 327 (FIG. 11B). This makes it possible to form the imaging apparatuses 100 in plural number that are coupled by the sealing section 131 and the wiring substrate 327.

Figure 11D:
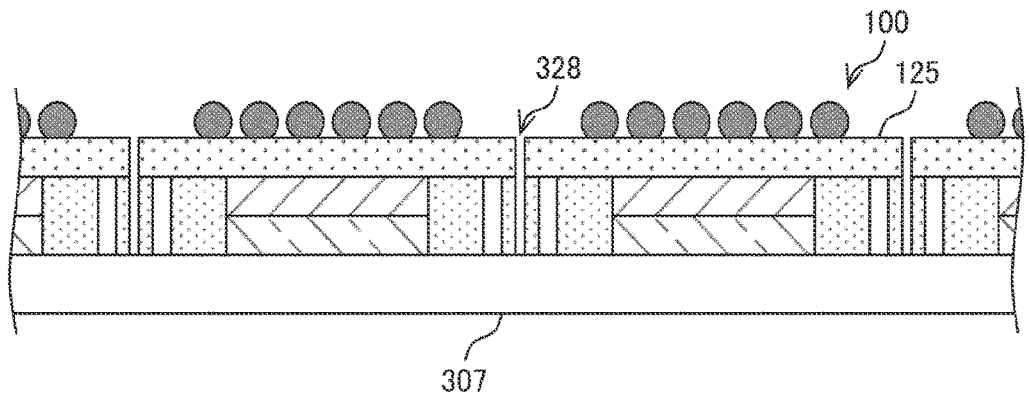

Next, the imaging apparatuses 100 in plural number that are coupled by the sealing section 131 is stuck to the dicing tape 307 (FIG. 11C), and the imaging apparatuses 100 are singulated by forming trenches 328 in the sealing section 131 by dicing (FIG. 11D). Next, the dicing tape 307 is removed. This makes it possible to manufacture the imaging apparatuses 100. The manufacturing method described above illustrates an example of forming the sealing section 131 and the fitting sections 140 simultaneously.

It should be noted that the manufacturing method of the imaging apparatus 100 is not limited to this example. For example, it is possible to apply the manufacturing method in which the fitting sections 140 are formed after the sealing of the imaging element 110 as described in FIGS. 6A, 6B, and 6C.

Because components of the imaging apparatus 100 other than the above are similar to those of the imaging apparatus 100 described in the first embodiment of the present disclosure, the description thereof will be omitted.

As described above, the wiring substrates 125 including the wiring layer 126 that is extended into the region outside the imaging element 110 are arranged in the imaging apparatus 100 of the second embodiment of the present disclosure, which makes it possible to distribute the wiring substrate pads 124 over a relatively wide area. The wiring substrate pads 124 and the connection sections 150 can be arranged at larger pitches, which makes the mounting easy.

3. Third Embodiment

In the imaging apparatus 100 of the above second embodiment, the light transmission section 114 having the same size as the imaging elements 110 is used. In contrast, the imaging apparatus 100 of a third embodiment differs from that of the above second embodiment in that the light transmission section larger in size than the imaging elements 110 is used.

[Cross-Sectional Configuration of Imaging Apparatus]

Figure 12:
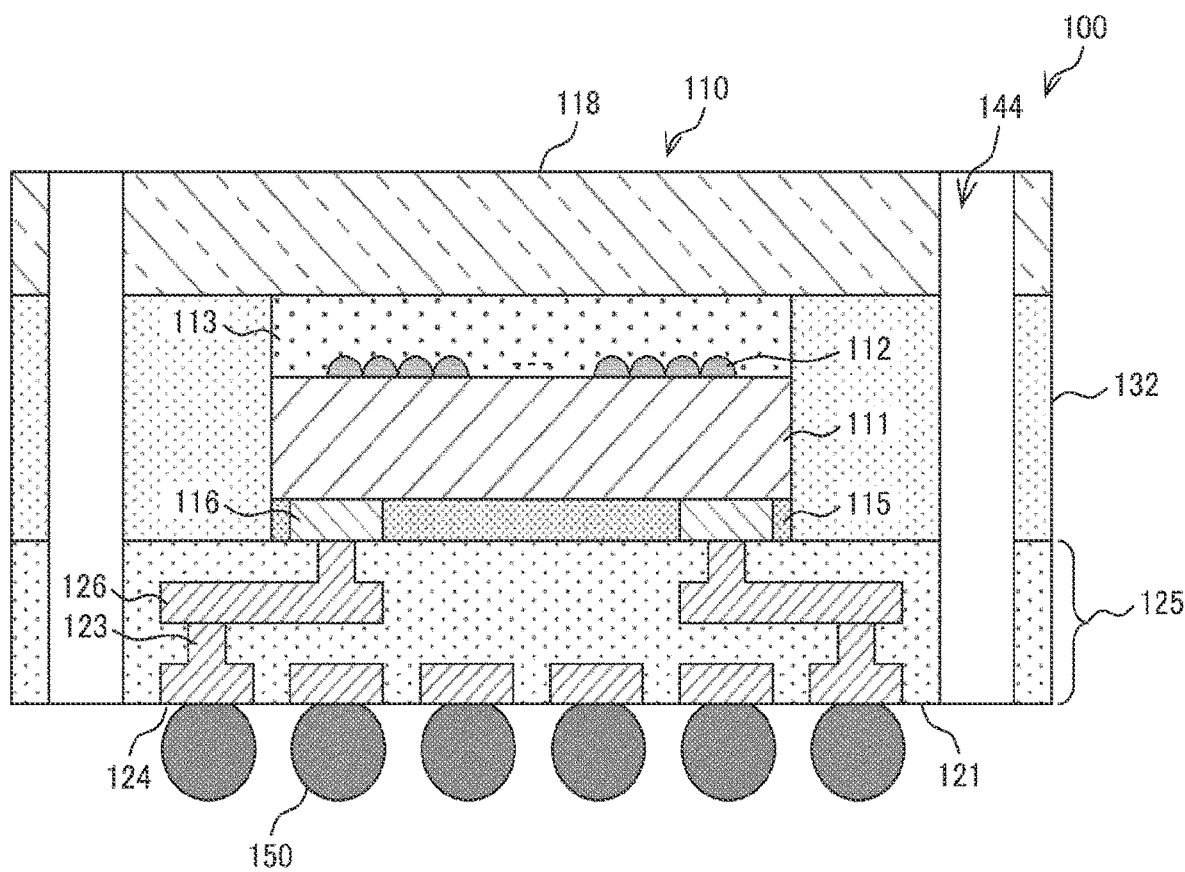
FIG. 12 is a cross-sectional view illustrating an example of a configuration of an imaging apparatus according to a third embodiment of the present disclosure.

FIG. 12 is a cross-sectional view illustrating an example of a configuration of an imaging apparatus according to a third embodiment of the present disclosure. FIG. 12 is a schematic cross-sectional view illustrating an example of a configuration of the imaging apparatus 100 as is FIG. 9. The imaging apparatus 100 differs from the imaging apparatus 100 illustrated in FIG. 9 in that a sealing section 132, a light transmission section 118, and fitting sections 144 are arranged in place of the sealing section 131, the light transmission section 114, and the fitting sections 140.

The light transmission section 118 is a substrate that transmits incident light as is the light transmission section 114. The light transmission section 118 is arranged in such a manner as to extend into the region outside the imaging chip 111. The light transmission section 118 illustrated in FIG. 12 is in the same size as the wiring substrate 125 in plan view. Also, the fitting sections 144 which will be described later are perforated in the light transmission section 118.

The fitting sections 144 are perforated in the wiring substrate 125 illustrated in FIG. 12 unlike in the wiring substrate 125 illustrated in FIG. 9.

The sealing section 132 is a sealing section that is arranged adjacent to the side surfaces of the imaging elements 110 and is arranged adjacent to the wiring substrate 125 and the light transmission section 118 in the region outside the imaging element 110. The fitting sections 144 are formed in the sealing section 132.

The fitting sections 144 are fitting sections in the form that penetrates the sealing section 132, the wiring substrate 125, and the light transmission section 118. The fitting sections 144 allow alignment with the lens unit 200.

Because the entire light-receiving surface of the imaging apparatus 100 illustrated in FIG. 12 includes the light transmission section 118, it is possible to planarize the light-receiving surface with ease. It is possible to reduce an error in the tilt direction at the time of the arrangement of the lens unit 200. Also, an end face of the light transmission section 118 is separated from that of the imaging chip 111, which makes it possible to reduce impacts of incident light reflected by the end face of the light transmission section 118.

[Manufacturing method of imaging apparatus] FIGS. 13A, 13B, 13C, 13D, 13E, 14A, 14B, 14C, 14D, and 14E illustrate an example of diagrams of a manufacturing method of the imaging apparatus according to the third embodiment of the present disclosure. FIGS. 13A, 13B, 13C, 13D, 13E, 14A, 14B, 14C, 14D, and 14E illustrate an example of diagrams of manufacturing steps of the imaging apparatus 100 as are FIGS. 10A, 10B, 10C, 10D, 10E, 11A, 11B, 11C, and 11D. These manufacturing steps differ from those illustrated in FIGS. 10A, 10B, 10C, 10D, 10E, 11A, 11B, 11C, and 11D in that the singulated imaging chips 111 are rearranged on the light transmission substrate which is used as the material of the light transmission section 118.

Figure 13A:
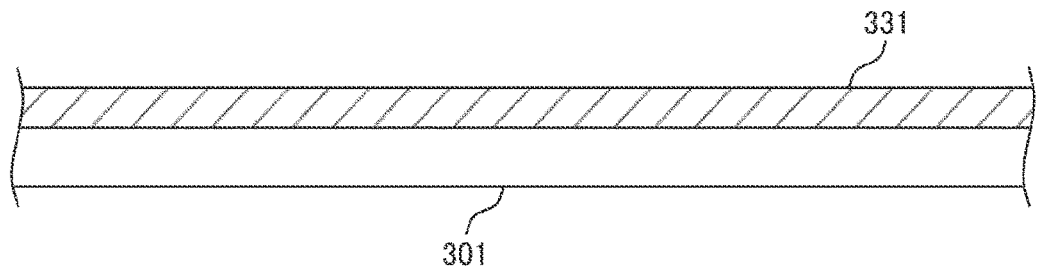
FIGS. 13A, 13B, 13C, 13D, and 13E illustrate an example of diagrams of a manufacturing method of the imaging apparatus according to the third embodiment of the present disclosure.

First, an imaging element 331 in the form of a semiconductor wafer is formed. The imaging element 331 is a semiconductor wafer on which the plurality of imaging chips is formed. The imaging element 321 is stuck to the dicing tape 301 (FIG. 13A).

Figure 13B:
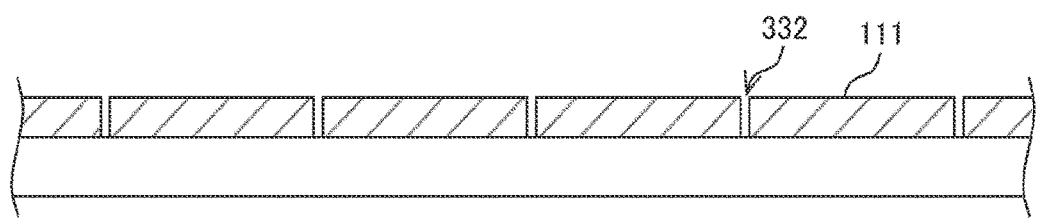

Next, the imaging element 331 is diced by forming trenches 332 in the imaging element 331 with the dicing blade. The imaging element 331 is singulated into the plurality of imaging chips 111 (FIG. 13B).

Figure 13C:
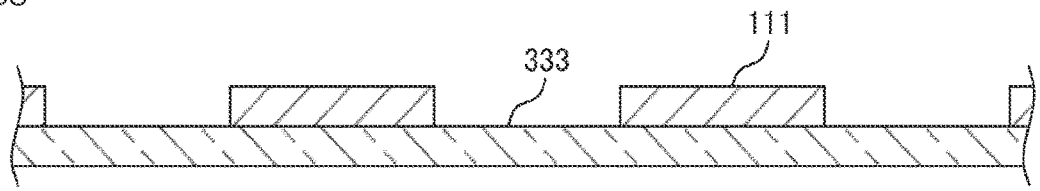

Next, the singulated imaging chips 111 are rearranged on a transparent substrate 333. At this time, the imaging chips 111 are bonded to the transparent substrate 333 with the adhesive 113 (not illustrated) (FIG. 13C).

Figure 13D:
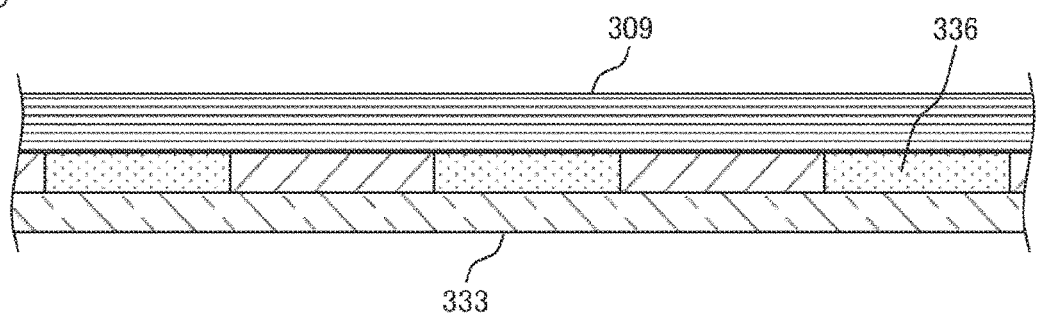
Figure 13E:
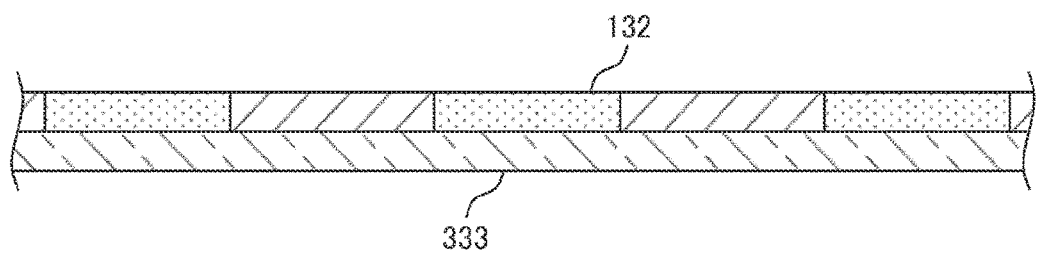

Next, the mold 309 described in FIG. 6A is arranged adjacent to the imaging chips 111. Next, resin 336 which is used as the material of the sealing section 132 is poured between the mold 309 and the transparent substrate 333 and cured (FIG. 13D). Next, the mold 309 is removed. This makes it possible to arrange the sealing section 131 adjacent to the side surfaces of the imaging chips 111 and the transparent substrate 333 in the regions outside the imaging chips 111. This makes it also possible to seal the imaging element 110 (FIG. 13E). The step in question is an example of the sealing step defined in the claims.

Figure 14A:
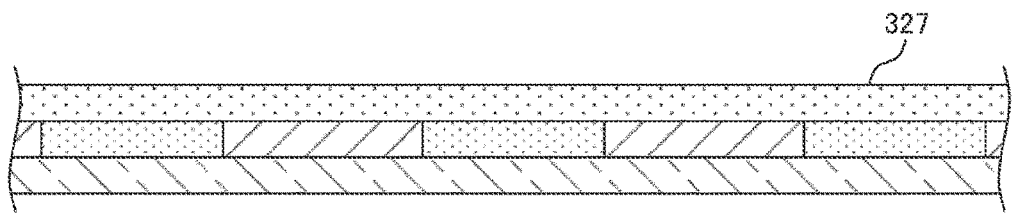
FIGS. 14A, 14B, 14C, 14D, and 14E illustrate the example of diagrams of the manufacturing method of the imaging apparatus according to the third embodiment of the present disclosure.

Next, the wiring substrate 327 described in FIGS. 11A, 11B, 11C, and 11D are arranged on the rear surface of the imaging element 110 (FIG. 14A). The step in question is an example of the wiring substrate arrangement step defined in the claims.

Figure 14B:
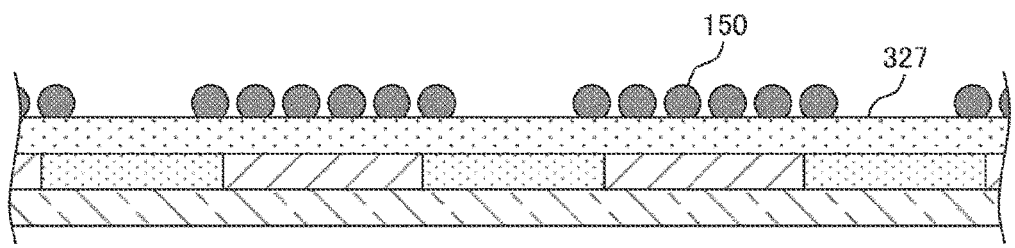

Next, the connection sections 150 are arranged on the wiring substrate pads 124 of the wiring substrate 327 (FIG. 14B). This makes it possible to form the imaging apparatuses 100 in plural number that are coupled by the sealing section 132, the wiring substrate 327, and the transparent substrate 333.

Figure 14C:
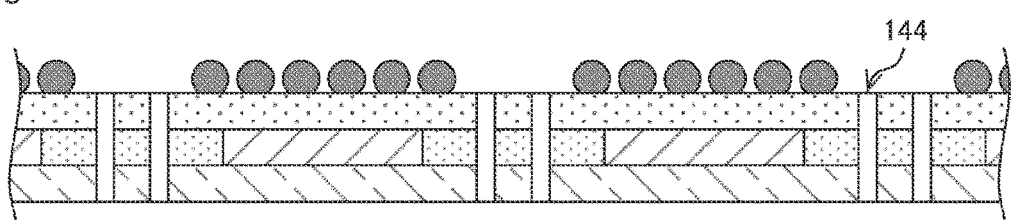
Figure 14D:
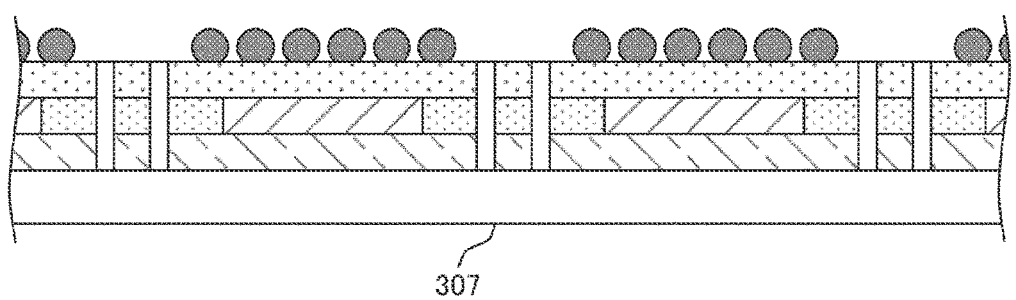

Next, the fitting sections 144 are arranged in the imaging apparatuses 100 in plural number that are coupled by the sealing section 132 and the like (FIG. 14C). This can be performed in a manner similar to the step descried in FIG. 6C. The step in question is an example of the fitting section arrangement step defined in the claims.

Figure 14E:
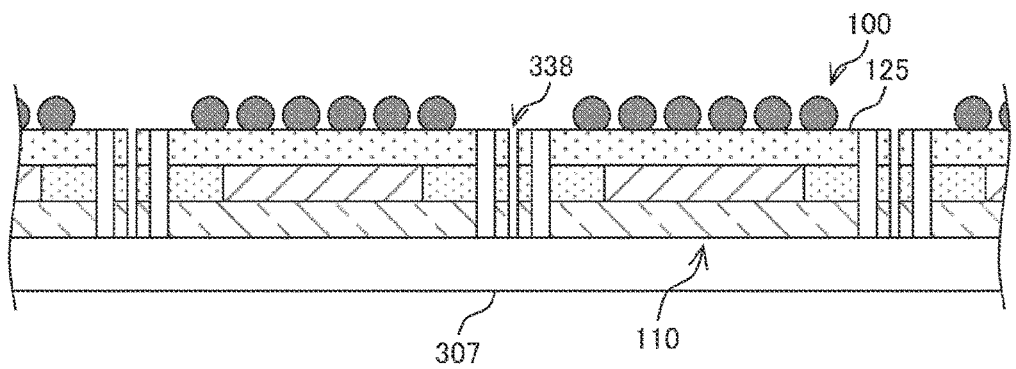

Next, the imaging apparatuses 100 in plural number that are coupled by the sealing section 132 and the like are stuck to the dicing tape 307 (FIG. 11D), and the imaging apparatuses 100 are singulated by forming trenches 338 in the sealing section 131 by dicing (FIG. 14E). Next, the dicing tape 307 is removed. This makes it possible to manufacture the imaging elements 110, which makes it possible to manufacture the imaging apparatuses 100. Because the resin molding sheet 303 is not used, it is possible to simplify the manufacturing steps of the imaging apparatuses 100.

Because components of the imaging apparatus 100 other than the above are similar to those of the imaging apparatus 100 described in the second embodiment of the present disclosure, the description thereof will be omitted.

As described above, the entire light-receiving surface of the imaging apparatus 100 includes the light transmission section 118 in the imaging apparatus 100 of the third embodiment of the present disclosure, which makes it possible to improve the alignment accuracy at the time of the arrangement of the lens unit 200.

4. Example of Application to Camera

The technology according to the present disclosure (present technology) is applicable to a variety of products. For example, the present technology may be realized as an imaging element incorporated in the imaging apparatus such as a camera.

Figure 15:
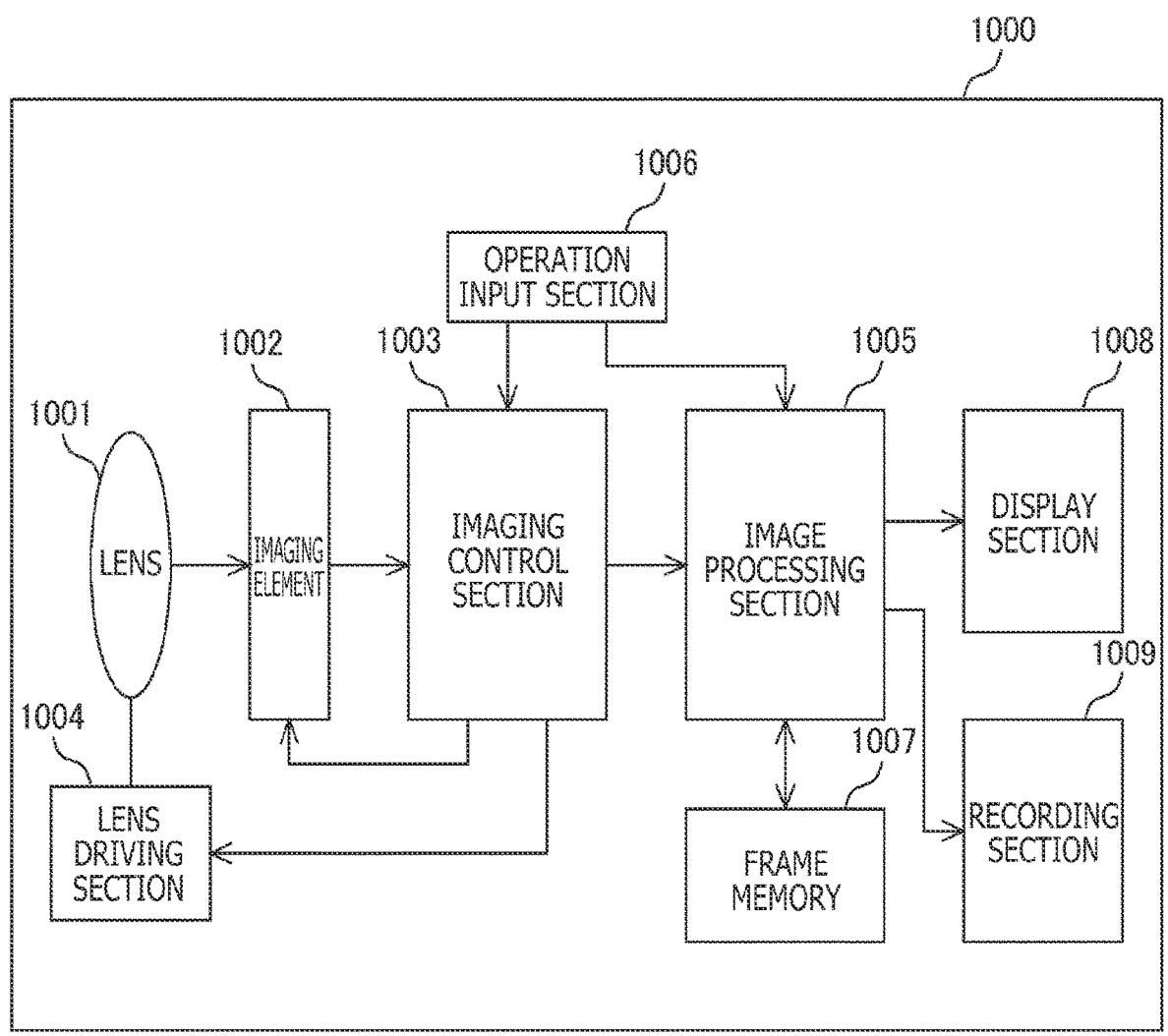
FIG. 15 is a block diagram illustrating an example of a schematic configuration of a camera which is an example of the imaging apparatus to which the present technology is applicable.

FIG. 15 is a block diagram illustrating an example of a schematic configuration of the camera which is an example of the imaging apparatus to which the present technology is applicable. A camera 1000 illustrated in FIG. 15 includes a lens 1001, an imaging element 1002, an imaging control section 1003, a lens driving section 1004, an image processing section 1005, an operation input section 1006, a frame memory 1007, a display section 1008, and a recording section 1009.

The lens 1001 is an imaging lens of the camera 1000. The lens 1001 forms a subject image by concentrating light from the subject and causing the light to enter the imaging element 1002 which will be described later.

The imaging element 1002 is a semiconductor element that captures an image of the light from the subject concentrated by the lens 1001. The imaging element 1002 generates an analog image signal commensurate with the light applied, converts the analog image signal into a digital image signal, and outputs the digital image signal.

The imaging control section 1003 controls imaging of the imaging element 1002. The imaging control section 1003 controls the imaging element 1002 by generating a control signal and outputting the control signal to the imaging element 1002. Also, the imaging control section 1003 can achieve autofocus on the camera 1000 on the basis of the image signal output from the imaging element 1002. Here, autofocus refers to a system that detects a focal position of the lens 1001 and automatically adjusts the focal position. As this autofocus, a scheme that detects the focal position by detecting an image plane phase difference with phase difference pixels arranged in the imaging element 1002 (image plane phase difference autofocus) can be used. Also, a scheme that detects, as the focal position, the position that provides the highest contrast of the image (contrast autofocus) can also be applied. The imaging control section 1003 achieves the autofocus by adjusting the position of the lens 1001 through the lens driving section 1004 on the basis of the detected focal position. It should be noted that the imaging control section 1003 can include, for example, a DSP (Digital Signal Processor) incorporating firmware.

The lens driving section 1004 drives the lens 1001 under control of the imaging control section 1003. The lens driving section 1004 can drive the lens 1001 by changing the position of the lens 1001 by using a built-in motor.

The image processing section 1005 processes an image signal generated by the imaging element 1002. For example, demosaicing, noise reduction, image signal encoding, and the like fall under the category of this process. Demosaicing generates an image signal of an insufficient color of the image signals corresponding to red, green, and blue of each pixel. Noise reduction removes noise from the image signal. The image processing section 1005 can include, for example, a microcomputer incorporating firmware.

The operation input section 1006 accepts operation input from a user of the camera 1000. A push button and a touch panel can be, for example, used as the operation input section 1006. The operation input accepted by the operation input section 1006 is conveyed to the imaging control section 1003 and the image processing section 1005. Thereafter, a process commensurate with the operation input such as imaging of the subject is activated.

The frame memory 1007 is a memory that stores a frame that is one screen's worth of an image signal. The frame memory 1007 holds the frame in the course of image processing under control of the image processing section 1005.

The display section 1008 displays an image processed by the image processing section 1005. For example, the display section 1008 can use a liquid crystal panel.

The recording section 1009 records the image processed by the image processing section 1005. A memory card and a hard disk can be, for example, used as the recording section 1009.

The camera to which the present disclosure is applicable has been described above. The present technology is applicable to the imaging element 1002 of the components described above. Specifically, the imaging apparatus 100 described in FIG. 1 is applicable to the imaging element 1002. It is possible to downsize the camera 1000 by applying the imaging apparatus 100 to the imaging element 1002. Also, it is possible to apply the imaging module 10 described in FIG. 3 to the lens 1001 and the imaging element 1002.

It should be noted that the fitting sections 141 and 142 illustrated in FIGS. 7A and 7B and the fitting sections 143 illustrated in FIGS. 8A and 8B can be applied to the imaging apparatus 100 illustrated in FIGS. 9 and 12.

Finally, the description of the above respective embodiments is merely an example of the present disclosure, and the present disclosure is not limited to the above embodiments. Accordingly, it is a matter of course that various changes other than the above respective embodiments can be made commensurate with a design or the like without departing from the technical idea according to the present disclosure.

It should be noted that advantageous effects described in the present specification are merely illustrative and not restrictive. Also, there may be other advantageous effects.

Also, the drawings in the above embodiments are schematic, and dimensional ratios of the respective sections and the like do not necessarily agree with the actual ones. Also, it is a matter of course that portions whose dimensional relations and ratios differ between the drawings are included.

It should be noted that the present technology can also have the following configurations.

(1)

An imaging apparatus including:
an imaging element including an imaging chip and pads, a light transmission section that transmits incident light being arranged on the imaging chip, the imaging chip generating an image signal on the basis of the incident light that has transmitted through the light transmission section, the pads being arranged on a bottom surface of the imaging chip that is a surface different from the surface on which the light transmission section is arranged and conveying the generated image signal;
a wiring substrate including wiring that is connected to the pads, the imaging element being arranged on a front surface of the wiring substrate;
a sealing section arranged adjacent to side surfaces of the imaging chip that are the surfaces adjacent to the bottom surface of the imaging chip and configured to seal the imaging chip; and
fitting sections arranged in the sealing section and into which part of a lens unit for forming an optical image on the imaging element is fitted.

(2)

The imaging apparatus according to (1), in which the fitting sections include a recess portion.

(3)

The imaging apparatus according to (2), in which the fitting sections include the recess portion that includes a through hole.

(4)

The imaging apparatus according to (1), in which the fitting sections include a notch.

(5)

The imaging apparatus according to (1), in which the fitting sections include a projection portion.

(6)

The imaging apparatus according to any one of (1) to (5), in which
the fitting sections are formed simultaneously with the sealing section.

(7)

The imaging apparatus according to any one of (1) to (6), in which
the sealing section is arranged adjacent to the side surfaces of the imaging chip on which the wiring substrate is arranged.

(8)
The imaging apparatus according to (7), in which
the sealing section is further arranged on the side surfaces of the wiring substrate which are the surfaces adjacent to the front surface of the wiring substrate.

(9)
The imaging apparatus according to any one of (1) to (7), in which
the wiring substrate includes wiring that extends into a region outside the imaging element.

(10)
The imaging apparatus according to (9), in which
the wiring substrate is arranged on the bottom surface of the imaging chip on which the sealing section is arranged.

(11)
The imaging apparatus according to any one of (1) to (5) and (7) to (10), in which
the light transmission section extends into a region outside the imaging chip, and
the sealing section is arranged adjacent to the light transmission section in the extended region.

(12)
The imaging apparatus according to any one of (1) to (10), in which
the sealing section is arranged adjacent to the side surfaces of the light transmission section which are the surfaces adjacent to an upper surface onto which the incident light is applied, and the surface of the sealing section onto which the incident light is applied is in the form of a flat surface that stretches over the upper surface.

(13)
The imaging apparatus according to any one of (1) to (12), in which
the imaging apparatus further includes a lens unit that forms an optical image on the imaging element, and
the fitting section fits onto part of the lens unit.

(14)
A manufacturing method of an imaging apparatus, including:
a wiring substrate arrangement step of arranging a wiring substrate on an imaging element, the wiring substrate including wiring that is connected to pads and on which the imaging element is arranged on a front surface of the wiring substrate, the imaging element including an imaging chip and the pad, a light transmission section that transmits incident light being arranged on the imaging chip, the imaging chip generating an image signal on the basis of the incident light that has transmitted through the light transmission section, the pads being arranged on a bottom surface of the imaging chip that is a surface different from the surface on which the light transmission section is arranged and conveying the generated image signal;
a sealing step of arranging a sealing section that seals the imaging chip adjacent to side surfaces of the imaging chip which are the surface adjacent to the bottom surface of the imaging chip; and
a fitting section arrangement step of arranging, in the sealing section, fitting sections into which part of a lens unit that forms an optical image on the imaging element fits.

REFERENCE SIGNS LIST

10: Imaging module
100: Imaging apparatus
110, 1002: Imaging element
111: Imaging chip
113: Adhesive
114, 118: Light transmission section
115: Insulating film
116: Pad
120, 125: Wiring substrate
121: Insulating layer
122, 126: Wiring layer
124: Wiring substrate pad
130 to 132: Sealing section
140 to 144: Fitting section
150: Connection section
200: Lens unit
210: Lens barrel
211: Projection portion
220: Imaging lens
1001: Lens

The invention claimed is:
1. An imaging apparatus, comprising:
an imaging element that includes an imaging chip, pads, and a light transmission section configured to transmit incident light, wherein
the light transmission section is on the imaging chip,
the imaging chip is configured to generate an image signal based on the incident light that has transmitted through the light transmission section,
the pads are on a bottom surface of the imaging chip that is different from a top surface of the imaging chip on which the light transmission section is present, and
the pads are configured to convey the generated image signal;
a wiring substrate that includes wiring that is connected to the pads,
wherein the imaging element is on a front surface of the wiring substrate;
a sealing section adjacent to side surfaces of the imaging chip, wherein
the sealing section is on side surfaces of the wiring substrate,
the side surfaces of the wiring substrate are adjacent to the front surface of the wiring substrate,
the imaging chip is on the wiring substrate,
the side surfaces of the imaging chip are adjacent to the bottom surface of the imaging chip, and
the side surfaces of the imaging chip are configured to seal the imaging chip; and
fitting sections in the sealing section, wherein
a part of a lens unit fits into the fitting sections, and
the lens unit is configured to form an optical image on the imaging element.

2. The imaging apparatus of claim 1, wherein the fitting sections include a recess portion.

3. The imaging apparatus of claim 2, wherein the recess portion includes a through hole.

4. The imaging apparatus of claim 1, wherein the fitting sections include a notch.

5. The imaging apparatus of claim 1, wherein the fitting sections include a projection portion.

6. The imaging apparatus of claim 1, wherein the fitting sections are formed simultaneously with the sealing section.

7. The imaging apparatus of claim 1, wherein the wiring substrate includes wiring that extends into a region outside the imaging element.

8. The imaging apparatus of claim 7, wherein
the wiring substrate is on the bottom surface of the imaging chip.

9. The imaging apparatus of claim 1, wherein
the light transmission section extends into a region outside the imaging chip, and
the sealing section is adjacent to the light transmission section in the extended region.

10. The imaging apparatus of claim 1, wherein
the sealing section is adjacent to side surfaces of the light transmission section,
the side surfaces of the light transmission section are adjacent to an upper surface of the light transmission section onto which the incident light is applied, and
a surface of the sealing section onto which the incident light is applied is a flat surface that stretches the upper surface of the light transmission section.

11. A manufacturing method of an imaging apparatus, comprising:
arranging a wiring substrate on an imaging element, wherein
the wiring substrate includes wiring that is connected to pads,
the imaging element is on a front surface of the wiring substrate,
the imaging element includes an imaging chip, the pads, and a light transmission section configured to transmit incident light,
the light transmission section is on the imaging chip,
the imaging chip is configured to generate an image signal based on the incident light that has transmitted through the light transmission section,
the pads are on a bottom surface of the imaging chip that is different from a top surface of the imaging chip on which the light transmission section is present, and
the pads are configured to convey the generated image signal;
arranging a sealing section configured to seal the imaging chip, wherein
the sealing section is on side surfaces of the wiring substrate,
the side surfaces of the wiring substrate are adjacent to the front surface of the wiring substrate,
the imaging chip is on the wiring substrate,
the sealing section is adjacent to side surfaces of the imaging chip, and
the side surfaces of the imaging chip are adjacent to the bottom surface of the imaging chip; and
arranging, in the sealing section, fitting sections into which a part of a lens unit fits, wherein the lens unit is configured to form an optical image on the imaging element.

12. An imaging apparatus, comprising:
an imaging element that includes an imaging chip, pads, and a light transmission section configured to transmit incident light, wherein
the light transmission section is on the imaging chip,
the imaging chip is configured to generate an image signal based on the incident light that has transmitted through the light transmission section,
the pads are on a bottom surface of the imaging chip that is different from a top surface of the imaging chip on which the light transmission section is present, and
the pads are configured to convey the generated image signal;
a wiring substrate that includes wiring that is connected to the pads,
wherein the imaging element is on a front surface of the wiring substrate;
a sealing section adjacent to side surfaces of the imaging chip, wherein
the side surfaces of the imaging chip are adjacent to the bottom surface of the imaging chip,
the side surfaces of the imaging chip configured to seal the imaging chip,
the light transmission section extends into a region outside the imaging chip, and
the sealing section is adjacent to the light transmission section in the extended region; and
fitting sections in the sealing section, wherein
a part of a lens unit fits into the fitting sections, and
the lens unit is configured to form an optical image on the imaging element.

* * * * *